(12) United States Patent
Diorio et al.

(10) Patent No.: US 7,242,614 B2
(45) Date of Patent: *Jul. 10, 2007

(54) REWRITEABLE ELECTRONIC FUSES

(75) Inventors: Christopher J. Diorio, Shoreline, WA (US); Frédéric J. Bernard, Fuveau (FR); Todd E. Humes, Shoreline, WA (US); Alberto Pesavento, Seattle, WA (US)

(73) Assignee: IMPINJ, Inc., Seattle, WA (US)

( * ) Notice: Subject to any disclaimer, the term of this patent is extended or adjusted under 35 U.S.C. 154(b) by 1 day.

This patent is subject to a terminal disclaimer.

(21) Appl. No.: 10/813,907

(22) Filed: Mar. 30, 2004

(65) Prior Publication Data

US 2005/0219931 A1 Oct. 6, 2005

(51) Int. Cl.
*G11C 11/34* (2006.01)
*G11C 17/18* (2006.01)

(52) U.S. Cl. .......................... 365/185.08; 365/185.26; 365/185.28; 365/225.7

(58) Field of Classification Search ................ 365/154, 365/156, 185.07, 185.08, 185.26, 185.28, 365/225.7; 257/294; 438/257; 706/33
See application file for complete search history.

(56) References Cited

U.S. PATENT DOCUMENTS

| | | | |
|---|---|---|---|
| 4,158,239 A * | 6/1979 | Bertin | 365/154 |
| 4,541,073 A * | 9/1985 | Brice et al. | 365/185.07 |
| 4,571,704 A | 2/1986 | Bohac, Jr. | |
| 4,758,869 A * | 7/1988 | Eitan et al. | 257/294 |
| 4,935,702 A | 6/1990 | Mead et al. | |
| 5,018,102 A * | 5/1991 | Houston | 365/154 |
| 5,068,622 A | 11/1991 | Mead et al. | |
| 5,086,331 A | 2/1992 | Hartgring et al. | |
| 5,124,568 A | 6/1992 | Chen et al. | |
| 5,323,066 A | 6/1994 | Feddeler et al. | |
| 5,438,542 A | 8/1995 | Atsumi et al. | |
| 5,659,498 A | 8/1997 | Pascucci et al. | |
| 5,677,917 A | 10/1997 | Wheelus et al. | |

(Continued)

FOREIGN PATENT DOCUMENTS

EP       0 336 500       3/1989

(Continued)

OTHER PUBLICATIONS

Raszka, Jaroslav, et al., "Embedded Flash Memory for Security Applications in a 0.13 μm CMOS Logic Process", IEEE 2004 International Solid-State Circuits Conference, Feb. 16, 2004, pp. 46-47.

(Continued)

*Primary Examiner*—Trong Phan
(74) *Attorney, Agent, or Firm*—Thelen Reid Brown Raysman & Steiner LLP

(57) ABSTRACT

Rewriteable electronic fuses include latches and/or logic gates coupled to one or more nonvolatile memory elements. The nonvolatile memory elements are configured to be programmed to memory values capable of causing associated electronic circuits to settle to predetermined states as power-up or reset signals are applied to the fuses. Although not required, the nonvolatile memory elements used in the rewriteable electronic fuses may comprise floating-gate transistors. An amount of charge stored on the floating gate of a given floating-gate transistor determines the memory value and, consequently, the state to which a fuse settles upon power-up or reset of the fuse.

103 Claims, 27 Drawing Sheets

U.S. PATENT DOCUMENTS

| | | | |
|---|---|---|---|
| 5,729,155 A | 3/1998 | Kobatake | |
| 5,731,716 A | 3/1998 | Pascucci | |
| 5,736,764 A | 4/1998 | Chang | |
| 5,761,121 A | 6/1998 | Chang | 365/185.14 |
| 5,777,926 A | 7/1998 | Trinh et al. | |
| 5,801,994 A | 9/1998 | Chang et al. | |
| 5,825,063 A | 10/1998 | Diorio et al. | 257/316 |
| 5,835,402 A | 11/1998 | Rao et al. | |
| 5,841,165 A | 11/1998 | Chang et al. | |
| 5,875,126 A | 2/1999 | Minch et al. | 365/185.01 |
| 5,892,712 A | 4/1999 | Hirose et al. | |
| 5,898,613 A | 4/1999 | Diorio et al. | 365/185.03 |
| 5,901,084 A | 5/1999 | Ohnakado | |
| 5,912,841 A | 6/1999 | Kim | |
| 5,912,842 A | 6/1999 | Chang et al. | |
| 5,912,937 A | 6/1999 | Goetting et al. | |
| 5,914,894 A | 6/1999 | Diorio et al. | 365/185.03 |
| 5,966,329 A | 10/1999 | Hsu et al. | |
| 5,982,669 A | 11/1999 | Kalnitsky et al. | |
| 5,986,927 A | 11/1999 | Minch et al. | 365/185.01 |
| 5,990,512 A | 11/1999 | Diorio et al. | 257/314 |
| 6,055,185 A | 4/2000 | Kalnitsky et al. | |
| 6,111,785 A | 8/2000 | Hirano | |
| 6,125,053 A | 9/2000 | Diorio et al. | 365/185.03 |
| 6,137,723 A | 10/2000 | Bergemont et al. | |
| 6,141,247 A * | 10/2000 | Roohparvar et al. | 365/185.08 |
| 6,144,581 A | 11/2000 | Diorio et al. | 365/185.03 |
| 6,214,666 B1 * | 4/2001 | Mehta | 438/257 |
| 6,222,765 B1 | 4/2001 | Nojima | 365/185.08 |
| 6,320,788 B1 | 11/2001 | Sansbury et al. | |
| 6,331,949 B1 | 12/2001 | Hirano | |
| 6,363,006 B2 * | 3/2002 | Naffziger et al. | 365/154 |
| 6,363,011 B1 * | 3/2002 | Hirose et al. | 365/185.08 |
| 6,384,451 B1 | 5/2002 | Caywood | |
| 6,452,835 B1 | 9/2002 | Diorio et al. | 365/185.03 |
| 6,456,992 B1 * | 9/2002 | Shibata et al. | 706/33 |
| 6,469,930 B1 * | 10/2002 | Murray | 365/185.07 |
| 6,477,103 B1 | 11/2002 | Nguyen et al. | 365/225.7 |
| 6,529,407 B2 | 3/2003 | Shukuri | |
| 6,573,765 B2 | 6/2003 | Bales et al. | |
| 6,590,825 B2 | 7/2003 | Tran et al. | |
| 6,633,188 B1 | 10/2003 | Jia et al. | |
| 6,654,272 B2 | 11/2003 | Santin et al. | |
| 6,661,278 B1 | 12/2003 | Gilliland | 327/536 |
| 6,664,909 B1 | 12/2003 | Hyde et al. | 341/144 |
| 6,693,819 B2 | 2/2004 | Smith et al. | |
| 6,724,657 B2 | 4/2004 | Shukuri | |
| 6,741,500 B2 | 5/2004 | DeShazo et al. | |
| 6,822,894 B1 | 11/2004 | Costello et al. | |
| 6,845,029 B2 * | 1/2005 | Santin et al. | 365/185.26 |
| 6,946,892 B2 | 9/2005 | Mitarashi | |
| 2002/0122331 A1 | 9/2002 | Santin et al. | |
| 2003/0123276 A1 | 7/2003 | Yokozeki | |
| 2003/0206437 A1 | 11/2003 | Diorio et al. | 365/185.03 |
| 2004/0004861 A1 | 1/2004 | Srinivas et al. | 365/185.21 |
| 2004/0021166 A1 | 2/2004 | Hyde et al. | 257/314 |
| 2004/0037127 A1 | 2/2004 | Lindhorst et al. | 365/202 |
| 2004/0052113 A1 | 3/2004 | Diorio et al. | 365/185.21 |
| 2005/0149896 A1 | 7/2005 | Madurawe | |

FOREIGN PATENT DOCUMENTS

| | | |
|---|---|---|
| EP | 0 326 883 | 8/1989 |
| EP | 0 756 379 | 1/1997 |

OTHER PUBLICATIONS

Carley, L. Richard, "Trimming Analog Circuits Using Floating-Gate Analog MOS Memory", IEEE Journal of Solid-State Circuits, vol. 24, No. 6, pp. 1569-1575, Dec. 1989.

Partial International Search for International Application No. PCT/US03/31792, date mailed Apr. 2, 2004.

International Search Report, Application No.: PCT/US 03/31792, date of mailing Aug. 12, 2004.

Witters, et al., "Analysis and Modeling of On-Chip High-Voltage Generator Circuits for Use in EEPROM Circuits", IEEE Journal of Solid-State Circuits, vol. 24, No. 5, Oct. 1989, pp. 1372-1380.

Notification of Transmittal of International Preliminary Examination Report on Patentability, International Application No. PCT/US05/10432, date mailed Jun. 19, 2006.

International Search Report for International Application No. PCT/US05/10434, date of mailing Sep. 13, 2005.

International Search Report for International Application No. PCT/US2005/010432, date of mailing Sep. 27, 2005.

International Search Report for International Application No. PCT/US2005/010431, date of mailing Sep. 27, 2005.

Declercq et al., "Design and Optimization of High-Voltage CMOS Devices Compatible With a Standard 5 V CMOS Technology", IEEE Custom Integrated Circuits Conference, 1993, pp. 24.6.1-24.6.4.

Dickson, "On-Chip High-Voltage Generation in MNOS Integrated Circuits Using an Improved Voltage Multiplier Technique", IEEE Journal of Solid-State Circuits, vol. SC-11, No. 3, Jun. 1976, pp. 374-378.

Invitation to Pay Additional Fees for PCT/US 03/31792 date of mailing Apr. 2, 2004.

* cited by examiner

REWRITEABLE ELECTRONIC FUSES

STATEMENT OF RELATED CASES

This case is related to U.S. patent application Ser. Nos. 10/814,866 and 10/814,868 filed on even date herewith, in the name of the same inventors, bearing the same title and commonly assigned herewith.

This case is also related to U.S. patent application Ser. No. 10/814,867 entitled "High-Voltage Switches in Single-Well CMOS Processes", filed on even date herewith in the name of inventors Frederic Bernard, Christopher J. Diorio, Troy N. Gilliland, Alberto Pasavento, Kaila Raby, Terry D. Hass and John Hyde and commonly assigned herewith.

FIELD OF THE INVENTION

The present invention relates generally to electronic fuses. More particularly, the present invention relates to rewriteable electronic fuses that use nonvolatile memory elements.

BACKGROUND OF THE INVENTION

Electronic fuses are commonly used in integrated circuits to define or alter the configuration or operation of the integrated circuits following fabrication. For example, in random access memories (RAMs) electronic fuses are typically used to enable redundant memory banks in place of memory banks determined to be defective during testing.

FIG. 1 shows a typical two-terminal electronic fuse 10. A low resistance material 12 such as nichrome metal or polysilicon is disposed between first 14 and second terminals 16. The electronic fuse 10 presents itself as a short circuit when not "programmed" and as an open circuit after it is programmed. The fuse 10 is programmed (i.e. is "blown") by forcing a high current through the low resistance material 12. The high current causes the low resistance material 12 to melt or rupture, thereby forming an open circuit between the first 14 and second terminals 16.

Another commonly used fuse element is the antifuse. An antifuse is, in effect, the opposite of a fuse, and presents itself as an open circuit when not programmed and as a short circuit after being programmed. FIG. 2 shows a typical antifuse element 20. A first metal or polysilicon terminal 22 of the antifuse is separated from a diffusion region 24, which embodies the second terminal of the antifuse, by a thin insulating layer 28 formed over a semiconductor substrate 26. Prior to being programmed the antifuse 20 presents itself as an open circuit. If during programming a sufficient voltage is applied across the polysilicon and diffusion terminals 22, 24, the thin insulating layer 28 melts, thereby shorting the polysilicon and diffusion terminals 22, 24 together.

In addition to being used to enable redundant memory in RAMs, fuses and antifuses are commonly used in programmable logic structures such as programmable logic devices (PLDs), programmable array logic (PAL), programmable logic arrays (PLAs), and field programmable gate arrays (FPGAs). Integrating fuses or antifuses with such logic structures allows a chip manufacturer to design a generic logic chip having uncommitted logic gates and circuits, which it can sell to many different users having varying circuit designs. A particular user can then configure (i.e. customize) the programmable chip by programming selected ones of the integrated fuses or antifuses as needed to implement the user's desired circuit design.

Programming a two-terminal fuse or antifuse element of the type described above is permanent. In many applications, however, it is desirable to have the ability to reprogram the fuse or antifuse elements. To satisfy this desire efforts have been made to provide a fuse technology that allows the logic gates and other circuit elements (e.g., as in an FPGA) to be reprogrammable. One known reprogrammable fuse approach uses a static RAM (SRAM) cell (or "memory element", the terms "cell" and "memory element" being used interchangeably herein) to control a switching element. Because the SRAM cell can have one of two output states, these two states can be used to control the opening or closing of the switch, thereby effectively implementing a fuse function. Whereas the SRAM/switch structure has the benefit of being reprogrammable, one drawback of its use relates to the fact that SRAM cells are volatile. This means that the fuse is unable to maintain its latched state after power is removed. A second problem with the SRAM/switch approach is that the state of the fuse is not immediately available upon power-up. In other words, the SRAM must first be programmed before the switching element can be configured to its intended state.

To overcome the volatility problem associated with the SRAM/switch structure, another known fuse technology approach uses bits stored in nonvolatile memory arrays, for example EEPROM (electrically erasable programmable read only memory) arrays to control the state of switches. Although this approach overcomes the volatility associated with the SRAM/switch approach, the problem remains that the states of the switches are not immediately available upon power-up. In other words, even if nonvolatile memory arrays such as EEPROM arrays are used, the bits must be first read out of the memory array and applied to the switches before the states of the switches are actually configured to their desired states.

SUMMARY OF THE INVENTION

Rewriteable electronic fuses having nonvolatile memory elements are disclosed. According to one aspect of the invention rewriteable electronic fuses comprise latches or other logic circuitry coupled to nonvolatile memory elements. The nonvolatile memory elements are configured to be programmed to memory values capable of causing the associated latches or other logic circuitry to settle to predetermined states as power-up or reset signals are applied to the fuses. Because the memory elements of a given fuse are nonvolatile, the fuses maintain their programmed state even after power is withdrawn from the fuses.

According to another aspect of the invention the nonvolatile memory elements used in the rewriteable electronic fuses may comprise floating-gate transistors. An amount of charge stored on the floating gate of a given floating-gate transistor determines the memory value and, consequently, the state to which the fuse settles upon power-up or reset of the fuse. Various rewriteable fuse embodiments are disclosed, including: asymmetric serial, asymmetric parallel, symmetric serial, symmetric parallel, half-latch, logic-gate, and master-slave fuses.

Other aspects of the inventions are described and claimed below, and a further understanding of the nature and advantages of the inventions may be realized by reference to the remaining portions of the specification and the attached drawings.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

In the drawings.

DETAILED DESCRIPTION

Embodiments of the present invention described in the following detailed description are directed at rewriteable electronic fuses. Those of ordinary skill in the art will realize that the detailed description is illustrative only and is not intended to restrict the scope of the claimed inventions in any way. Other embodiments of the present invention, beyond those embodiments described in the detailed description, will readily suggest themselves to those of ordinary skill in the art having the benefit of this disclosure. Reference will now be made in detail to implementations of the present invention as illustrated in the accompanying drawings. Where appropriate, the same reference indicators will be used throughout the drawings and the following detailed description to refer to the same or similar parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

As used herein, the symbol n+ indicates an n-doped semiconductor material typically having a doping level of n-type dopants on the order of $10^{21}$ atoms per cubic centimeter. The symbol n– indicates an n-doped semiconductor material typically having a doping level on the order of $10^{17}$ atoms per cubic centimeter. The symbol p+ indicates a p-doped semiconductor material typically having a doping level of p-type dopants on the order of $10^{21}$ atoms per cubic centimeter. The symbol p– indicates a p-doped semiconductor material typically having a doping level on the order of $10^{17}$ atoms per cubic centimeter. Those of ordinary skill in the art will now realize that the devices described herein may be formed on a conventional semiconductor substrate or they may as easily be formed as a thin film transistor (TFT) above the substrate, or in silicon on an insulator (SOI) such as glass (SOG), sapphire (SOS), or other substrates as known to those of ordinary skill in the art. Such persons of ordinary skill in the art will now also realize that a range of doping concentrations around those described above will also work. Essentially, any process capable of forming pFETs and nFETs will work. Doped regions may be diffusions or they may be implanted.

Figure 1:
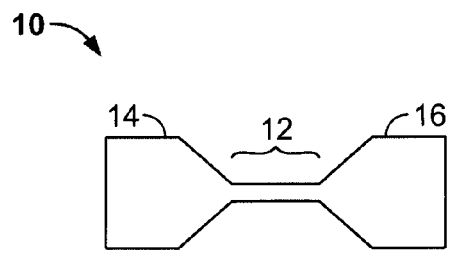
FIG. 1 shows a top view of a prior art two-terminal electronic fuse.
Figure 2:
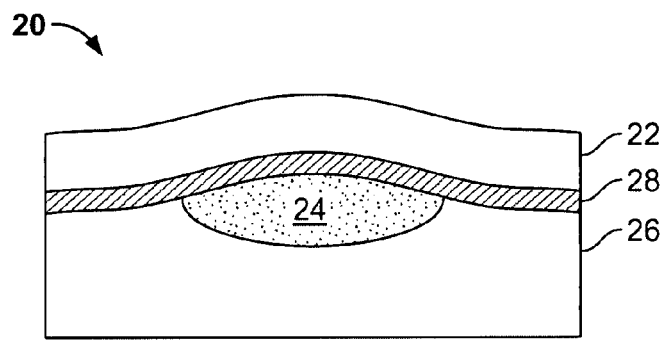
FIG. 2 shows a cross-sectional view of a typical prior art antifuse element.
Figure 3:
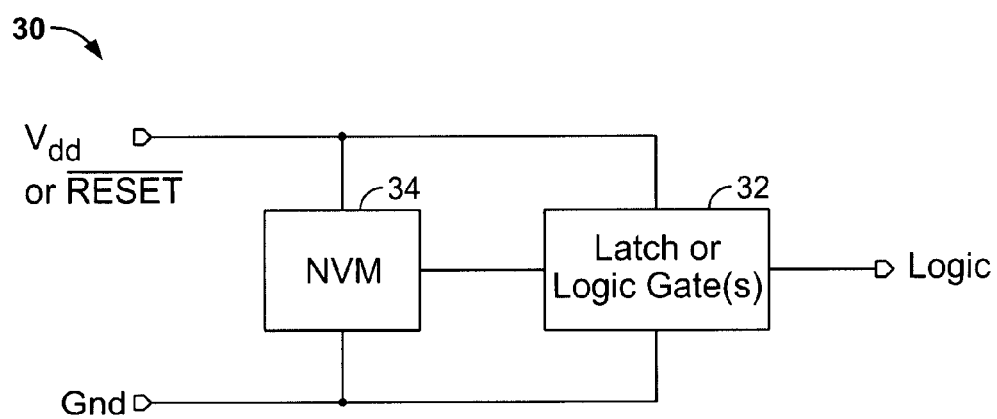
FIG. 3 shows a block diagram of a rewriteable electronic fuse, according to an embodiment of the present invention.

Referring first to FIG. 3, there is shown a block diagram of a rewriteable electronic fuse 30, according to an embodiment of the present invention. The rewriteable electronic fuse 30 is used in conjunction with (LOGIC) and comprises a latch (or logic gate(s)) 32 coupled to a rewriteable nonvolatile memory element 34. During operation, the latch or logic gate(s) 32 is coupled to a reset signal, $\overline{\text{RESET}}$, or to a power supply source, Vdd. As explained in more detail below, the nonvolatile memory element 34 is configured so that it may be programmed to a memory value capable of causing the latch or logic gate 32 to settle to a predetermined state as a power-up or a reset signal is applied to the fuse 30, i.e., as Vdd or $\overline{\text{RESET}}$ is applied to the fuse 30.

Figure 4:
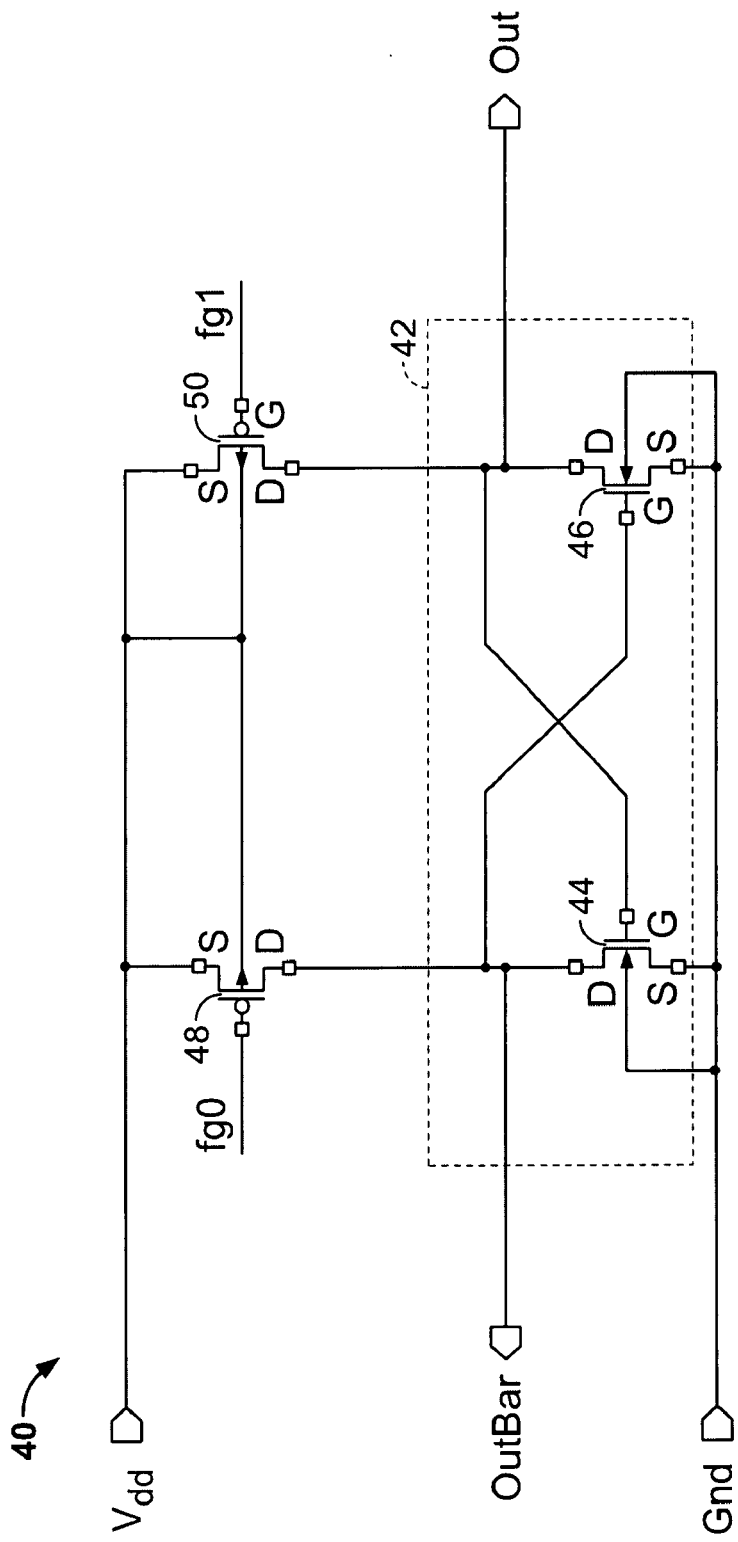
FIG. 4 shows a schematic diagram of an exemplary rewriteable half-latch fuse, according to an embodiment of the present invention.

FIG. 4 shows a schematic diagram of a rewriteable electronic fuse 40, according to a specific exemplary embodiment of the present invention. The fuse 40 comprises a half-latch circuit 42 including two cross-coupled n-channel MOSFETs (Metal Oxide Semiconductor Field Effect Transistors) 44 and 46. It should be mentioned that n-channel MOSFETs are referred to in this disclosure as "nFETs" and p-channel MOSFETs are referred to as "pFETs". A first nFET 44 of the half-latch 42 has a gate (G), which is coupled to the drain (D) of the second nFET 46. Similarly, the gate (G) of the second NFET 46 is coupled to the drain (D) of the first nFET 44. This configuration results in the first and second nFETs 44, 46 being "cross-coupled," thereby forming a half-latch. The drain of the first nFET 44 embodies a first output terminal, OutBar, of the fuse 40, and the drain of the second nFET 46 embodies a second and complementary output, Out, of the fuse 40. The sources(S) of both nFETs 44, 46 are coupled to a common terminal labeled Gnd (ground).

Whereas the first and second nFETs 44, 46 in FIG. 4 are assembled as a "half-latch", and, accordingly, are not technically an assembly of a "full" latch (e.g., two-cross-coupled inverters, as in some of the exemplary embodiments described below), for the purposes of this disclosure and the appended claims, the term "latch" is meant to cover both "half" and "full" latches. Additionally, whereas nFETs are shown in the half-latch in FIG. 4, those skilled in the art will now readily understand that latches using pFETs could also be used with only simple changes to biasing and signal connections needed. Hence, the latches used in the embodiments of the invention, as they are described and claimed herein, are not meant to be restricted to use of transistors of any particular conductivity type, and nFETs or pFETs alone or in combination may be used to implement the latches of the various fuse embodiments of the present invention, as will now be readily understood by those of ordinary skill in the art. Further, whereas MOSFET-type devices are used in the description of the latches used in the various embodiments, some applications may be amenable to supporting other, non-MOS transistor types. Accordingly, the latches of the embodiments of the present invention should further not be restricted to MOSFET-type devices.

As shown in FIG. 4, a first rewriteable nonvolatile memory element 48 is coupled to the first output terminal, OutBar, of the rewriteable electronic fuse 40, and a second rewriteable nonvolatile memory element 50 is coupled to the second and complementary output terminal, Out, of the fuse 40. More specifically, a drain (D) of the first nonvolatile memory element 48 is coupled to the first output terminal, OutBar, and the drain (D) of the second nonvolatile memory element 50 is coupled to the second output terminal, Out. The sources(S) of the first and second nonvolatile memory elements 48, 50 are both coupled to a power supply (or reset signal) input terminal (here illustrated as Vdd). First rewriteable nonvolatile memory element 48 has a floating gate fg0. Second rewriteable nonvolatile memory element 50 has a floating gate fg1. Because a nonvolatile memory element is coupled to each "side" of the half-latch, i.e., to both the OutBar and Out terminals, and because each nonvolatile memory element is coupled in series between the half-latch and the power-supply voltage (or reset) terminal, this embodiment of the present invention is referred to as a "symmetrical serial half-latch fuse".

The rewriteable fuse shown in FIG. 4 and other rewriteable fuse embodiments described in this disclosure are "self latching", meaning that once power is applied to the fuse, the latch of the associated fuse will eventually latch to some state. According to an aspect of the present invention, one or more nonvolatile memory elements provide memory values (e.g., voltages, currents), which influence the latch so that the state to which it latches upon power-up (or reset) is deterministic. In the absence of a nonvolatile memory element, the state to which the latch latches may not be deterministic, i.e., it may be essentially random.

A significant benefit of the "self-latching" aspect of the present invention is that upon or following power-up there is no need to address and read bits from a memory array (e.g., from an EEPROM or similar nonvolatile memory array) in order for the various fuse embodiments of the present invention to settle to their predetermined states. To illustrate the self-latching aspect of the invention suppose, for example, that prior to a power-up or reset of the fuse in FIG. 4, the memory value of the first nonvolatile memory element 48 results in the first nonvolatile memory element 48 being ON (meaning that there is a low impedance path between the drain and source terminals). Also suppose that the memory value of the second nonvolatile memory element 50 results in the second nonvolatile memory element 50 being OFF (meaning that there is a high impedance path between the drain and source terminals). Under these initial conditions, when Vdd (or reset signal) is applied to the power supply (or reset) input terminal of the fuse 40, the OutBar terminal is pulled up to Vdd (or the voltage value of the reset signal). Because the OutBar terminal is coupled to the gate of the second nFET 46 of the half-latch 42, the second nFET 46 turns ON and the Out terminal is pulled to ground (Gnd). Also, because the Out terminal is coupled to the gate of the first nFET 44 of the half-latch 42, the first nFET 44 is OFF and OutBar remains at Vdd (or the voltage value of the reset signal). Therefore, it is seen how the presence of the nonvolatile memory elements 48 and 50 operate to cause the half-latch 42 to latch to a predetermined state (OutBar=Vdd and Out=Gnd), as Vdd (or a reset signal) is applied to the power supply (or reset) input terminal of the fuse 40. As explained in more detail below, if the complementary state is desired, the memory values of the first and second nonvolatile memory elements 48 and 50 can be altered (i.e. "reprogrammed" or "rewritten") to cause the latch 42 to latch to the complementary state.

Figure 5A:
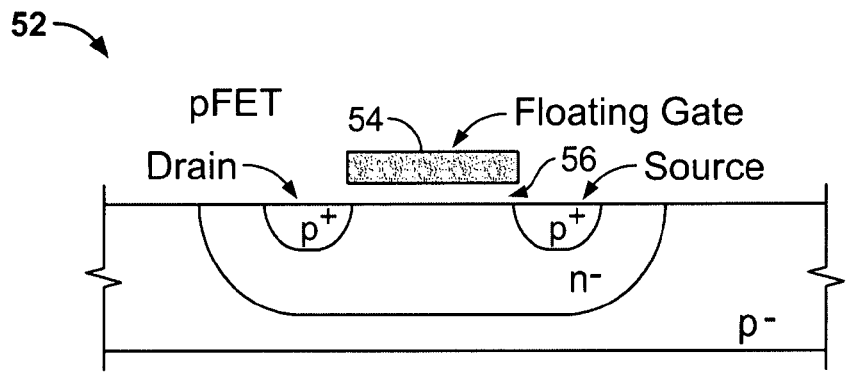
FIG. 5A shows a single-poly p-type floating-gate transistor, which may be used to form the nonvolatile memory elements of the various fuse embodiments of the present invention.

According to an aspect of the present invention, the nonvolatile memory elements in the various embodiments of the invention described in this disclosure may comprise floating-gate transistors. The amount of charge stored on the floating gate of a given floating-gate transistor determines the memory value provided and, consequently, the state to which the latch latches. FIG. 5A shows a floating-gate pFET 52, which may be used to form the first and/or second nonvolatile memory elements 48 and 50 in FIG. 4 and other nonvolatile memory elements in other embodiments of the invention. The floating-gate pFET 52 is formed in an n− well disposed in a p− substrate. A p+ source and p+ drain are formed in the n− well. The floating gate pFET includes a floating gate (fg) 54 disposed over a thin dielectric layer 56. Electrons may be added to and removed from the floating gate 54 by various mechanisms including Fowler-Nordheim (FN) tunneling, impact-ionized hot-electron injection (IHEI), direct (bi directional) tunneling (if the dielectric layer is thin enough), hot-hole injection, band-to-band tunneling induced hot-electron injection, ultraviolet radiation exposure, or a variety of other means as are well known to those practiced in the art. These charging mechanisms allow the various fuse embodiments of the present invention to be "rewriteable". Some of the various mechanisms for programming memory elements implemented using floating-gate transistors are described in more detail below.

Figure 5B:
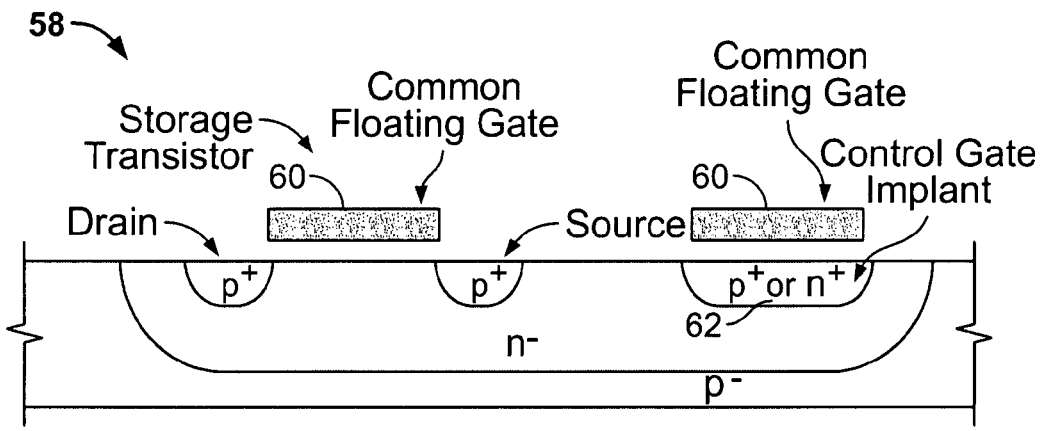
FIG. 5B shows a single-poly p-type floating-gate transistor structure having a control gate, which may be used to form the nonvolatile memory elements of the various fuse embodiments of the present invention.

FIG. 5B shows an alternative floating-gate pFET 58, which may be used to form the nonvolatile memory elements of the various fuse embodiments of the present invention. Similar to the floating-gate transistor 52 in FIG. 5A, the floating-gate transistor 58 in FIG. 5B has a single conductive layer used to form the floating gate 60 of the device. It comprises a storage transistor formed from an n− well disposed in a p− substrate, with a p+ gate and a p+ drain formed in the n− well. An additional control implant 62 (which may be p+ or n+) is included in the floating-gate transistor 58 in FIG. 5B to provide a control-gate terminal. The storage transistor and control implant 62 share floating gate 60, which is a common floating-gate. This type of floating-gate transistor 58 and how it may be programmed is described in U.S. Pat. No. 5,761,121.

Figure 5C:
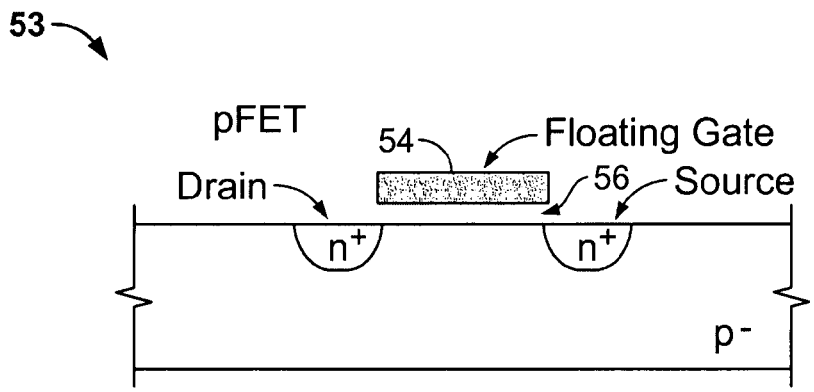
FIG. 5C shows a single-poly n-type floating-gate transistor structure which may be used to form the nonvolatile memory elements of the various fuse embodiments of the present invention.
Figure 5D:
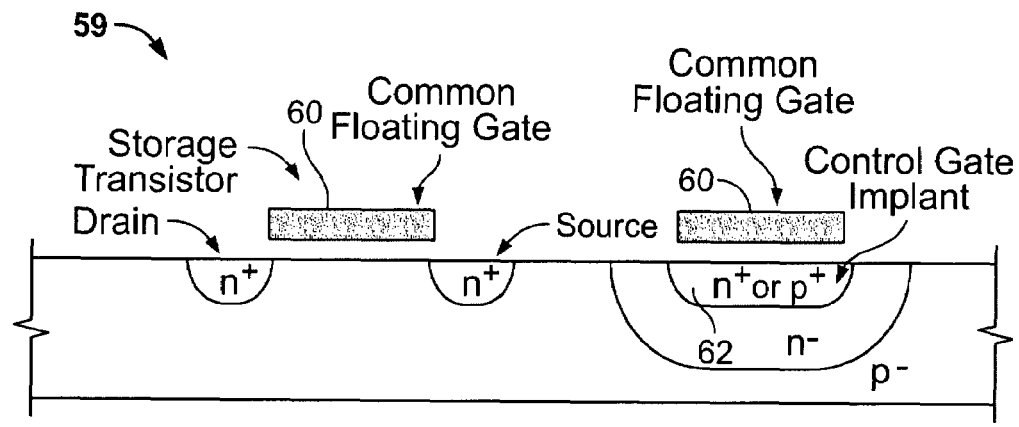
FIG. 5D shows a single-poly n-type floating gate transistor structure having a control gate, which may be used to form the nonvolatile memory elements of the various fuse embodiments of the present invention.
Figure 5E:
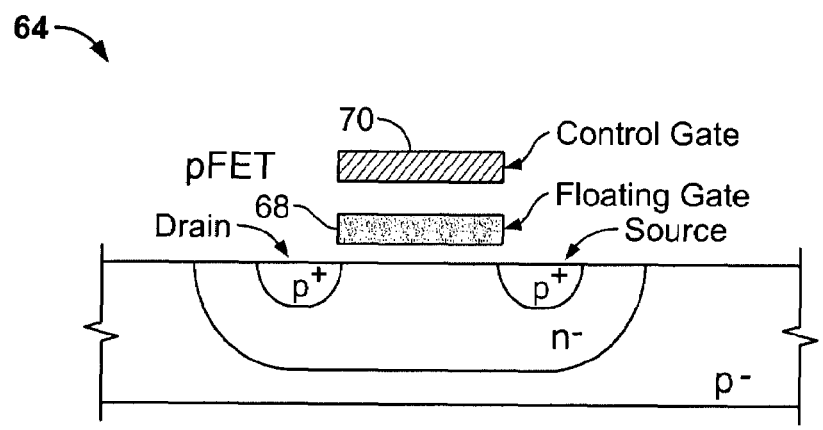
FIGS. 5E and 5F show double-poly floating-gate transistor structures which may be used to form the nonvolatile memory elements of the various fuse embodiments of the present invention.
Figure 5F:
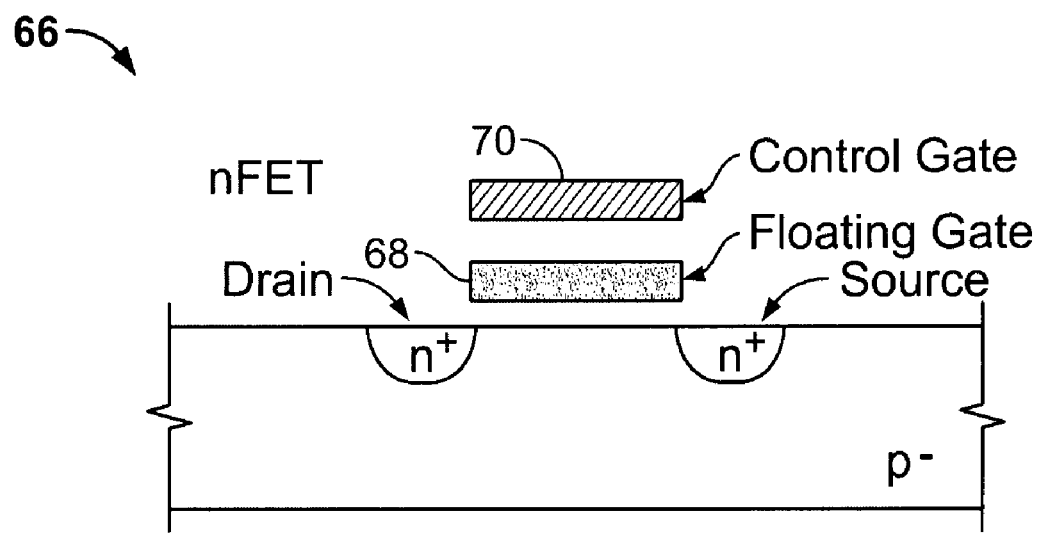

The floating-gate transistors 52 and 58 shown in FIGS. 5A and 5B are beneficial in that they use a single conductive gate layer (typically polysilicon). This single-layer architecture makes these types of nonvolatile memory elements and, consequently, the fuses within which they are embedded, amenable to fabrication in standard, single-poly CMOS (Complementary Metal Oxide Semiconductor) semiconductor fabrication processes. The nFETs 53 and 59 as shown in FIGS. 5C and 5D may also be utilized to realize CMOS compatible nonvolatile memory elements. In FIG. 5C. a storage transistor is formed of an n+ source region and an n+ drain region formed in a p− substrate, with a floating gate 54 provided over the channel disposed between the source and drain in FIG. 5D, the floating gate transistor 59 comprised of a storage transistor formed of n+ source region and n+ drain region disposed in a p− substrate includes an additional control gate implant 62 (which may be p+ or n+) which shares floating gate 60 with the storage transistor. Other types of floating-gate transistors may also be used to form the nonvolatile memory elements of the various fuse embodiments of the present invention. For example, FIGS. 5E and 5F show p-type and n-type floating-gate transistors 64 and 66, respectively, fabricated in a double-poly process. The floating gate 68 of each floating-gate transistor is formed in a first polysilicon layer, and a control gate 70 is formed in a second polysilicon layer. Other components of these transistors include, for the pFET, an n− well provided in a p− substrate, with a p+ drain and a p+ source formed in the n− well, and for the nFET, an n+ drain and an n+ source provided in a p– substrate. In accordance with alternative embodiments of the present invention, the double-poly floating-gate transistors shown in FIGS. 5E and 5F may be used to form the nonvolatile memory elements of the various fuse embodiments of the present invention.

Figure 6:
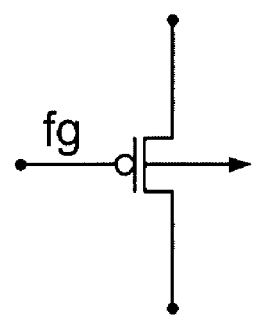
FIG. 6 shows a device symbol of a rewriteable nonvolatile p-channel floating-gate memory element, the "fg" label indicating that the associated transistor's gate is floating.

The floating-gate memory devices shown in FIGS. 5A–5F represent only a few of many floating gate structures that may be used to implement the nonvolatile memory elements in the various fuse embodiments of the present invention. Those of ordinary skill in the art will readily appreciate that any other floating gate device may be used, including nFETs, FinFETs, multiple-gate MOSFETs, etc. To simplify the description of the various embodiments of the present invention, the nonvolatile memory elements are assumed to be of the traditional floating-gate type. Accordingly, transistors in the drawings with the symbol "fg" next to them, e.g., as shown in FIG. 6, indicate an implementation of a floating-gate type of transistor. Nevertheless, whereas floating-gate type transistors may be beneficially used to implement and describe the various fuse embodiments of the present invention, those of ordinary skill in the art will now readily appreciate and understand that other mechanisms for nonvolatile memory stored that do not utilize floating gates may be used. Such alternative information storage mechanisms include, by way of example and not of limitation the following mechanisms well known to those of ordinary skill in the art: ferroelectric (e.g., FRAM (ferroelectric random access memory)), magnetoresistive (e.g., MRAM (magnetoresistive random access memory)), dielectric (e.g., dielectric storage via charge trapping in SONOS (silicon-oxide-nitride-oxide-silicon) structures, dielectric storage in conductive particles disposed in the dielectric for the purpose of providing charge trapping, other forms of charge trapping in the dielectric), phase-change (e.g., memory elements storing information based on phase-changes of a storage medium), and the like. Including for example, FRAM (Ferroelectric RAM), MRAM (Magnetoresistance RAM), dielectric storage (such as SONOS (Silicon-Oxide-Nitride-Oxide-Silicon)), phase-change memory elements, etc. Hence, the "fg" symbol next to the nonvolatile memory elements in the description and drawings of the exemplary embodiments should not be used to restrict the claimed inventions to fuses having only floating-gate type transistors for the nonvolatile memory elements.

Figure 7:
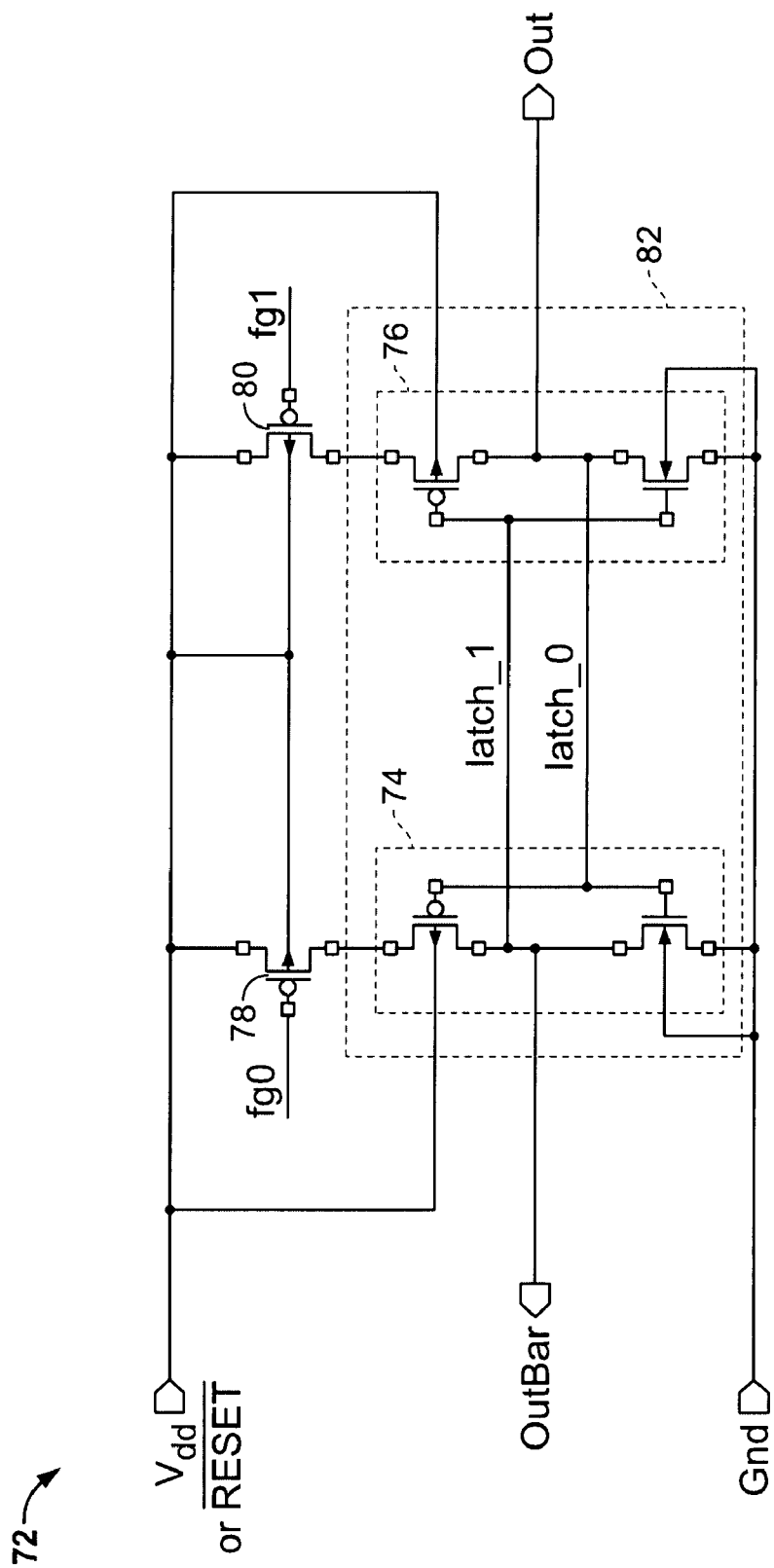
FIG. 7 shows a schematic diagram of an exemplary self-latching, rewriteable symmetric serial fuse, according to an embodiment of the present invention.

Referring now to FIG. 7, there is shown a rewriteable electronic fuse 72, according to an embodiment of the present invention. This "self-latching symmetric serial fuse" 72 comprises two cross-coupled CMOS inverters (the output of a first inverter connected to the input of a second inverter and the output of the second inverter connected to input of the first inverter) 74 and 76, and two nonvolatile memory elements 78 and 80. A first nonvolatile memory element 78 of the two nonvolatile memory elements 78 and 80 includes a floating gate fg0 and is coupled in series between a first 74 of the two inverters 74 and 76 and a power supply (or reset signal) input terminal, and the second nonvolatile memory element 80 includes a floating gate fg1 and is coupled in series between a second 76 of the two inverters 74 and 76 and the power supply (or reset signal) input terminal. Together the two cross-coupled inverters 74 and 76 form a full-latch 82, comprised of half-latches latch 1 and latch 0. Similar to the presence of the first and second nonvolatile memory elements 48, 50 in the symmetrical serial half-latch fuse 40 in FIG. 4, the first and second nonvolatile memory elements 78, 80 in the self-latching symmetric serial fuse 72 in FIG. 7 cause the latch 82 to settle to a predetermined state during a power-up or reset of the fuse 72. The state to which the latch 82 settles is determined by the memory values stored on the nonvolatile memory elements 78, 80.

Whereas the fuse embodiment in FIG. 7 is similar to that shown in FIG. 4, the embodiment in FIG. 7 does not require that the nonvolatile memory elements be completely ON or OFF in order for the latch to latch properly (i.e. to latch to the correct state), because the cross-coupled inverters must eventually settle to a latched state. Further, according to the embodiment in FIG. 7, it is not required that either of the floating-gate voltages, Vfg0 or Vfg1, be maintained at a value greater than Vdd in order to avoid static power consumption, because the cross-coupled inverters prevent static power consumption when latched. If either Vfg0 or Vfg1 in the half-latch fuse embodiment in FIG. 4 is not maintained above Vdd, the fuse 40 consumes power at all times, even during times prior to and after the latch 42 latches (i.e., at times when the fuse is in a static state). Hence, if power consumption is of concern in a particular application, the fuse embodiment shown in FIG. 7 may be preferable over the fuse embodiment shown in FIG. 4.

Figure 8:
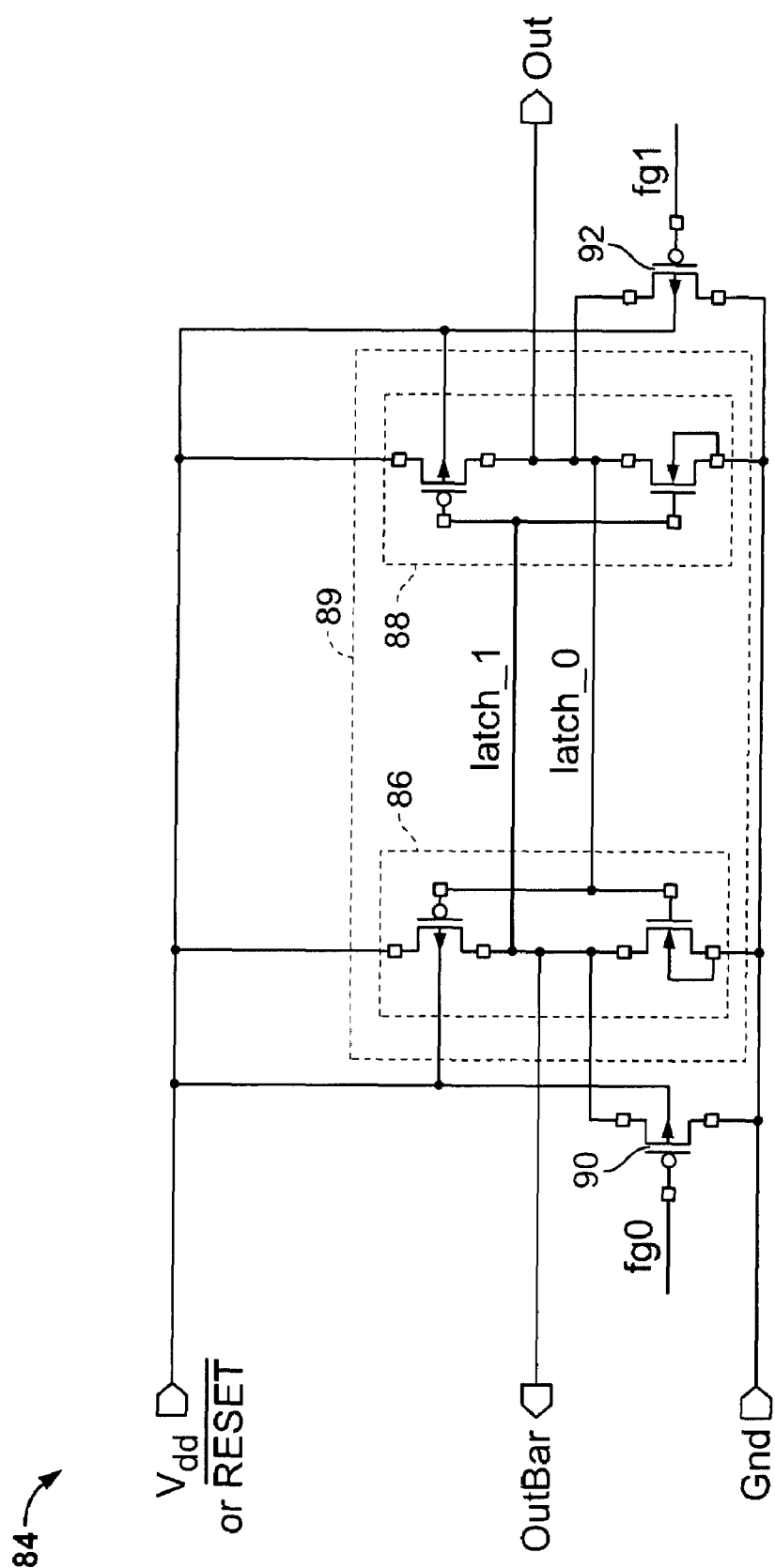
FIG. 8 shows a schematic diagram of an exemplary self-latching, rewriteable symmetric parallel fuse, according to an embodiment of the present invention.

FIG. 8 shows a rewriteable electronic fuse 84, according to an embodiment of the present invention. This "self-latching symmetric parallel fuse" 84 comprises two cross-coupled CMOS inverters 86 and 88, and two nonvolatile memory elements 90 and 92. Together the two cross-coupled inverters 86, 88 form a full-latch 89 comprised of half-latch latch 0 and half-latch latch 1. In accordance with this embodiment, a first 90 of the two nonvolatile memory elements 90, 92 includes a floating gate fg0 and is coupled in parallel with a transistor of a first one 86 of the two inverters 86, 88, and the second 92 of the two nonvolatile memory elements 90, 92 includes a floating gate fg1 and is coupled in parallel with a transistor of the second 88 of the two inverters 86, 88. Similar to the embodiments described above, and to those in other parts of this disclosure, the first and second nonvolatile memory elements 86, 88 in the self-latching symmetric parallel fuse 84 in FIG. 8 cause the latch 89 to settle to a predetermined state during a power-Lip or reset of the fuse 84. For example, assume that floating-gate transistors are used for the first and second nonvolatile memory elements 90, 92, and suppose the floating-gate voltage on the first nonvolatile memory element 90 (i.e. Vfg0) has been previously programmed to Vdd and that the floating-gate voltage on the second memory element (i.e. Vfg1) 92 has been previously programmed to Gnd. With Vfg0 Vdd, the first nonvolatile memory element 90 remains OFF. When Vdd (or a reset signal) is applied to the fuse 84, the second nonvolatile memory element 92 turns ON and the Out terminal is pulled down to Gnd. When Out is at Gnd, the latch will settle with OutBar at Vdd. Hence, the fuse 84 settles to the state: OutBar=Vdd and Out=Gnd. To program the fuse 84 to the complementary state, the memory values of the first and second nonvolatile memory elements would be reversed. For example, if floating-gate transistors are used to implement the nonvolatile memory elements 90, 92, the relative amount of charge stored on the floating gates of the memory elements would be modified so that Vfg0 is near or below Gnd, and Vfg1 is near or above Vdd. Finally, if the floating-gate transistors 90, 92 were constructed from nFETs rather than from pFETs, the logical polarities would be reversed (i.e. storing Vfg0=Gnd and Vfg1=Vdd would cause the latch to latch with Out=Gnd and OutBar=Vdd).

Figure 9:
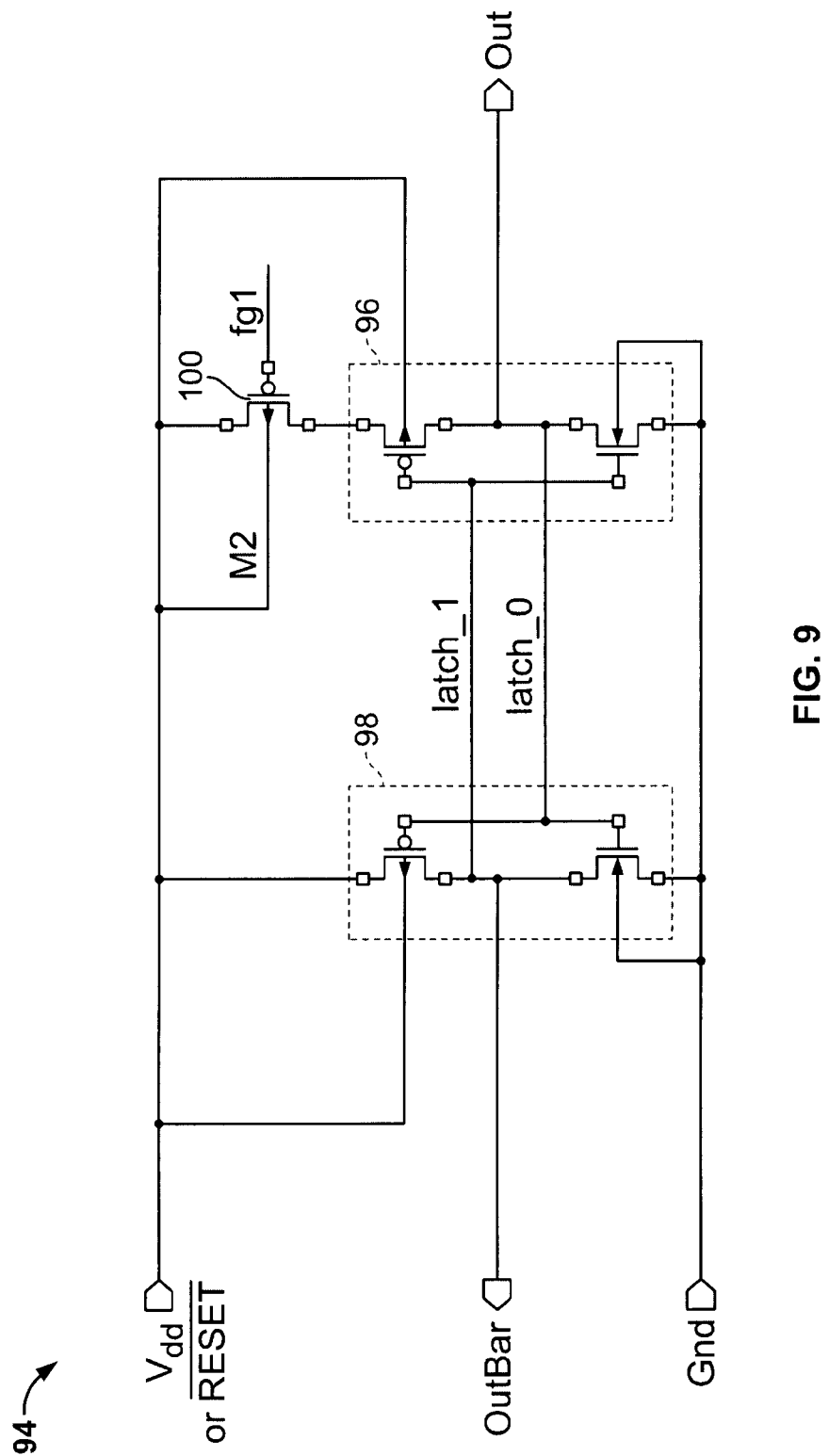
FIG. 9 shows a schematic diagram of an exemplary self-latching, rewriteable asymmetric serial fuse, according to an embodiment of the present invention.

FIG. 9 shows a rewriteable electronic fuse 94, according to an embodiment of the present invention. This "self-latching asymmetric serial fuse" 94 comprises two cross-coupled CMOS inverters 96 and 98 and a nonvolatile memory element 100 coupled in series between a first 96 of the two inverters 96, 98 and a power supply (or reset) input terminal. The two cross-coupled CMOS inverter 96 and 98 included A first half-latch 0 and second half-latch 1. So long as fg1 in the single nonvolatile memory element 100 is set near or above Vdd, pFET 100 will be turned off, and inverter 96 will not have a conduction path to Vdd (or to reset, as appropriate). Consequently, the latch will settle with Out=Gnd and OutBar=Vdd. If, however, fg1 is set well below Vdd, such that pFET 100 is turned on, the state to which the latch latches is not necessarily deterministic. To make the latching more deterministic, the gate width-to-length ratio of a pFET (or nFET, or both) of one of the two inverters 96, 98 can be adjusted so that the difference in transistor sizes beneficially disrupts the symmetry of the asymmetric latch when the nonvolatile memory element 100 is off, thereby influencing the fuse to latch deterministically with Out=Vdd and OutBar=Gnd. Other mechanisms for disrupting the symmetry of the latch will now be apparent to those of ordinary skill in the art. For example, the channel doping of the various transistors in the latch may be individually selected to achieve the same result, the relative channel doping reflecting the impedance of the transistor much the same way as the relative gate widths. Also, placing one or two capacitors between one or two latches outputs and a fixed voltage source such as Vdd or Gnd can achieve the same effect as discussed below, e.g., in connection with the discussion of FIG. 11. Other mechanisms for achieving the same result will now be readily apparent to those of ordinary skill in the art.

Figure 10:
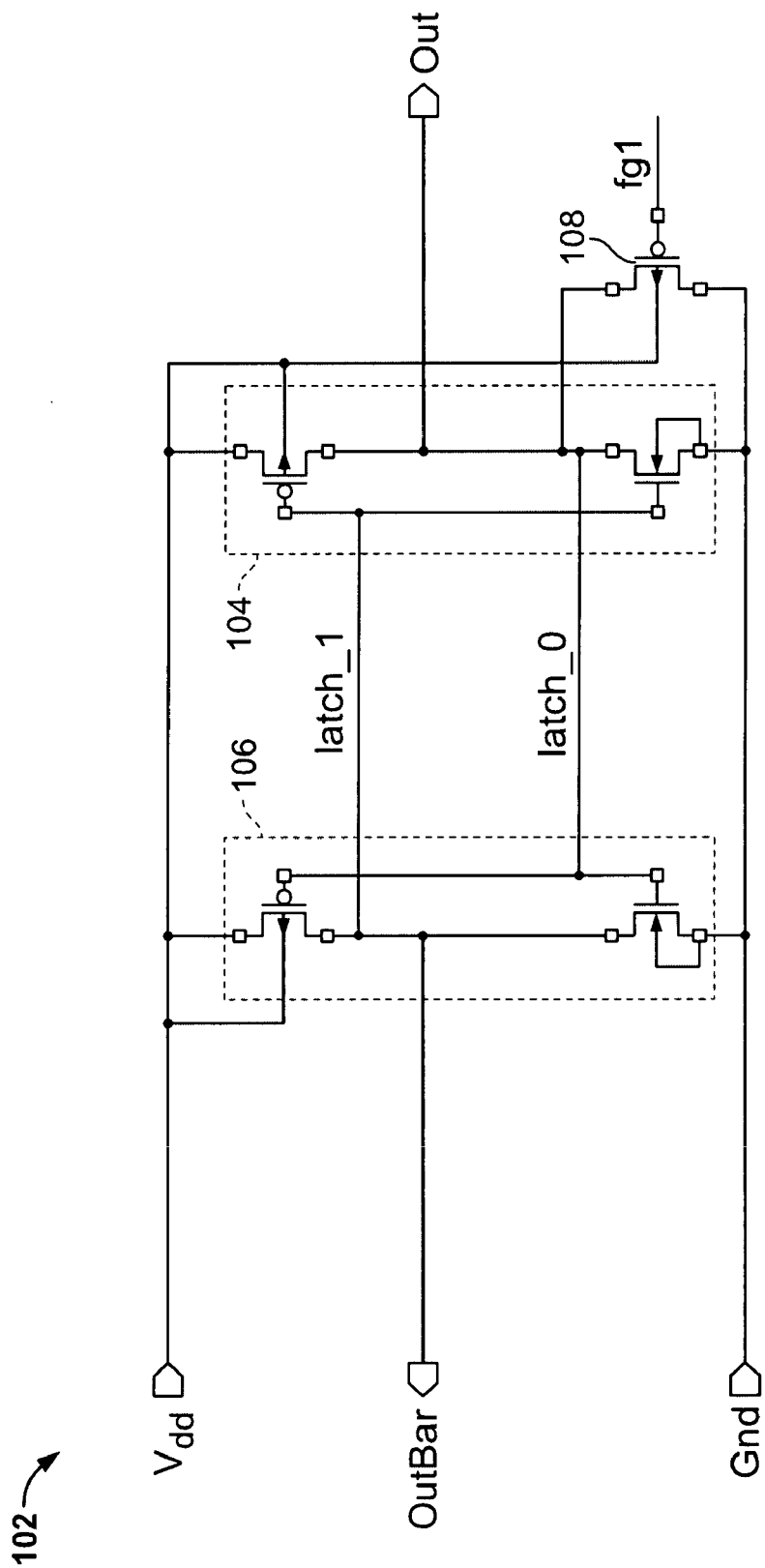
FIG. 10 shows a schematic diagram of an exemplary self-latching, rewriteable asymmetric parallel fuse, according to an embodiment of the present invention.

FIG. 10 shows a rewriteable electronic fuse 102, according to an embodiment of the present invention. This "self-latching asymmetric parallel fuse" 102 comprises two cross-coupled CMOS inverters 104 and 106 and a nonvolatile memory element 108 coupled in parallel with a transistor of one of the two inverters 104, 106. The inverters 104 and 106 include half-latch latch 0 and half-latch latch-1. So long as fg1 in the single nonvolatile memory element 108 is set near or below Gnd, pFET 108 will be turned on, and the output of inverter 104 will be pulled down to Gnd. Consequently, the latch will settle with Out=Gnd and OutBar=Vdd. If, however, fg1 is set well above Gnd, such that pFET 108 is turned off, the state to which the latch latches is not necessarily deterministic. To make the latching more deterministic, the gate width-to-length ratio of a pFET (or nFET, or both) of one of the two inverters 106, 108 can be adjusted so that the difference in transistor sizes beneficially disrupts the symmetry of the asymmetric latch when the nonvolatile memory element 108 is off, thereby influencing the fuse to latch deterministically with Out=Vdd and OutBar=Gnd.

Figure 11:
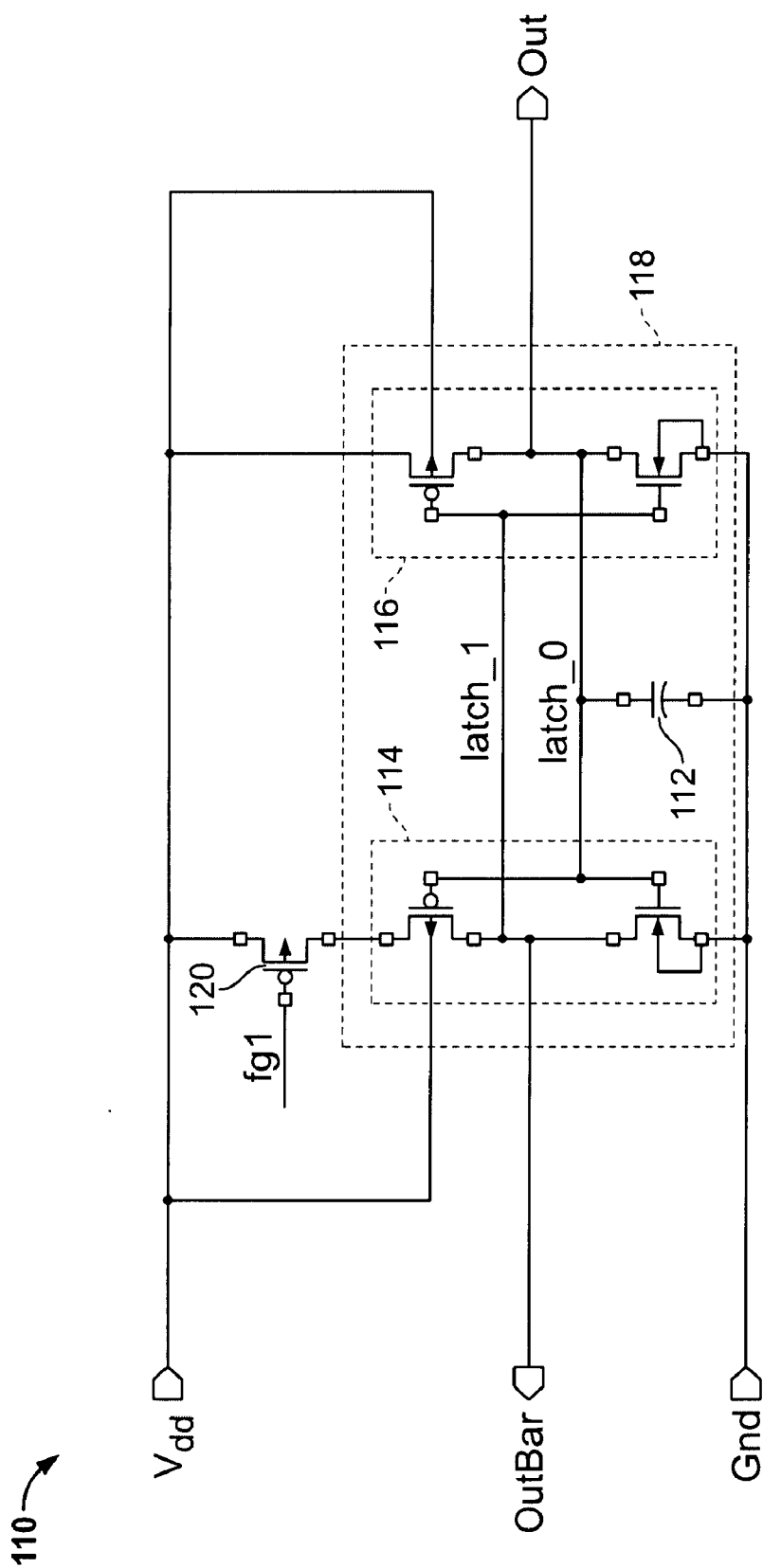
FIG. 11 illustrates how a capacitor may be coupled to an output of the latches of either of the asymmetric fuses shown in FIGS. 9 and 10 to enhance deterministic latching, according to an embodiment of the present invention.

FIG. 11 shows how, as an alternative (or in addition) to adjusting transistor sizes, a capacitor 112 may be coupled to either the OutBar or Out terminals of the asymmetric fuses 94, 102 in FIGS. 9 and 10, respectively, to enhance deterministic latching, according to an embodiment of the present invention. Consider FIG. 11 as an example. Suppose for this example that floating-gate fg1 is programmed so that pFET 120 is conducting. Before a power-up or reset, the Out terminal is at Gnd potential and capacitor 112 is discharged. Because the capacitor 112 is initially uncharged, as Vdd is ramped up the Out terminal can only rise slowly, because capacitor 112 must be charged. Consequently, as Vdd ramps up OutBar will rise more rapidly, causing the cross-coupled inverters 114, 116 of latch 118 to latch with OutBar high and Out low. Hence, the presence of the capacitor 112 aids the latch 118 to latch to a state with OutBar high and Out low.

Conversely, now consider the case where floating-gate fg1 is programmed so that pFET 120 is not conducting. Before a power-up or reset, the Out terminal is at Gnd potential and capacitor 112 is discharged. Because the capacitor 112 is initially uncharged, as Vdd is ramped up the Out terminal will rise slowly, because capacitor 112 must be charged. However, OutBar cannot rise at all, because pFET 120 is turned off so no current can flow to OutBar. Capacitor 112 will gradually charge up causing the cross-coupled inverters 114, 118 to latch with OutBar low and Out high. Hence, the presence of the capacitor 112 does not prevent the latch from latching to a state with OutBar low and Out high.

Whereas FIG. 11 shows how a single capacitor 112 may be coupled to either the OutBar or Out terminals of the asymmetric fuses 94, 102 shown in FIGS. 9 and 10, respectively, to enhance deterministic latching, in an alternative embodiment a first capacitor may be coupled between the Out terminal and Gnd, and a second capacitor may be coupled between OutBar and Gnd. The addition of the second capacitor helps ensure that any of the latches in the embodiments of FIGS. 4, 7, 8, 9, and 10 latches to a predetermined state. This embodiment is useful if, for example, there is a glitch on Vdd or reset signal, or Vdd or reset signal are disturbed as they ramp up, and/or if some of the latch nodes are not at ground potential as Vdd or reset signal are applied. Because one of the capacitors must be charged for either Out or OutBar to settle to Vdd or the reset signal voltage, the latch times of the signals latch0 and latch1 are slowed down, so supply glitch transient events or transistor mismatch become less of a problem in determining what state the latch eventually settles to. In essence, a latch with capacitors must draw more charge from Vdd or reset signal to latch, so it is less likely to latch to the incorrect state. The capacitors also help to ensure that the proper state is maintained after the latching process, if for some reason Vdd or reset signal are disturbed after the latch has settled.

As described above, disrupting the symmetry of the asymmetric fuse embodiments by adding one or more capacitors to the latch outputs, or employing different size transistors on opposing sides of the latch, helps ensure that the latch latches to a predetermined state. However, other approaches to disrupting the symmetry can be taken. For example, electrical components such as resistors, inductors, etc. may be connected in series or in parallel with one of the nonvolatile memory elements, or one or more capacitors could be coupled between one or both of the Out and OutBar terminals and Vdd, the reset signal, or another terminal, or capacitors or other electrical elements could be added to other circuit nodes. Likewise, other approaches to slowing down the latching of any of the fuse embodiments can be taken, such as coupling one or more capacitors between one or both of the Out and OutBar terminals (or other latch terminals) and Vdd, the reset signal, or another node. Indeed, those of ordinary skill in the art will now readily appreciate and understand that any mechanism employed to disrupt the symmetry of an asymmetric fuse when its nonvolatile memory element is ON falls within the spirit and scope of this aspect of the invention; likewise, any mechanism that requires any of the latches to latch more slowly, to help ensure that the latch latches to the proper state, also falls within the spirit and scope of this aspect of the invention.

Figure 12A:
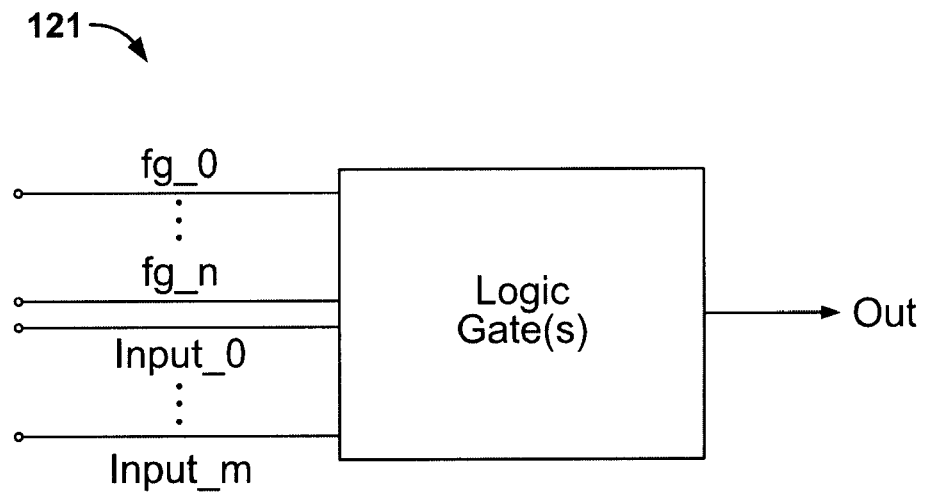
FIG. 12A shows a block diagram of an exemplary rewriteable logic-gate fuse, according to an embodiment of the present invention.
Figure 12B:
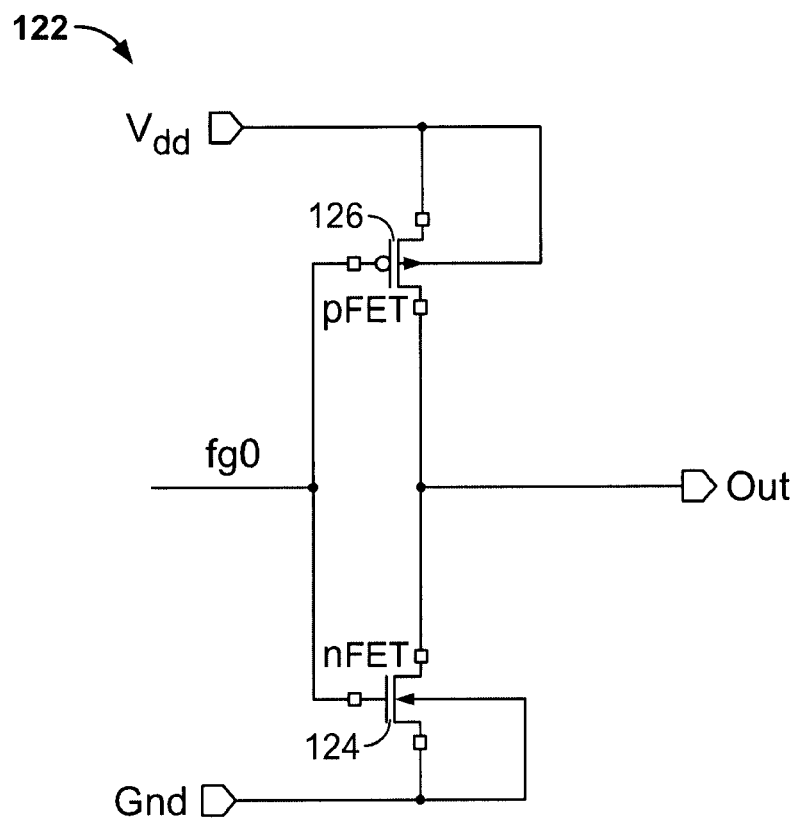
FIG. 12B shows a schematic diagram of an exemplary rewriteable logic-gate fuse where the logic-gate is an inverter, according to an embodiment of the present invention.
Figure 12C:
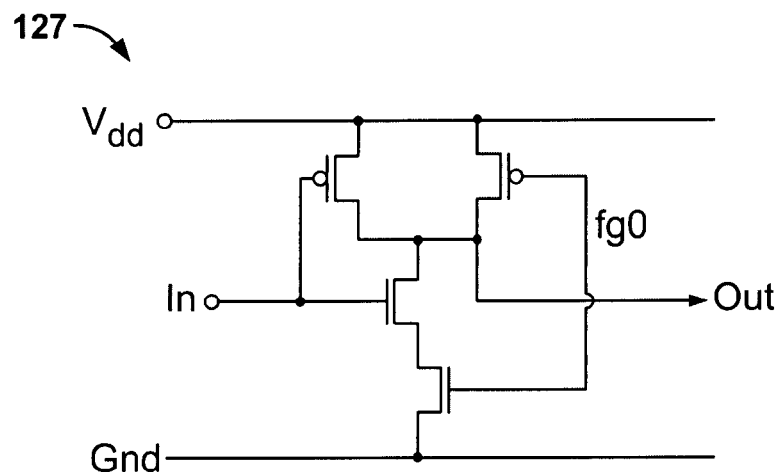
FIG. 12C shows a schematic diagram of an exemplary rewriteable logic-gate fuse where the logic-gate is a NAND gate, according to an embodiment of the present invention.

Referring now to FIGS. 12A, 12B, and 12C, there are shown rewriteable electronic logic-gate fuses 121, 122, and 127, according to embodiments of the present invention, in which a logic gate is combined with one or more nonvolatile memory elements, rather than combining a latch with one or more nonvolatile memory elements as described in the fuse embodiments above. In the generic logic-gate fuse embodiment shown in FIG. 12A, a logic gate 121 with n fuse inputs (fg-0-fg-n) and m data inputs (input-0-input-m) implements an (n+m) input logic function. Those of ordinary skill in the art will readily understand that logic gate 121 can represent any of the standard logic function such as AND, OR, NAND, NOR, XOR, and XNOR, as well as complex combinations of these generic functions. In the particular embodiment shown in FIG. 12B, logic gate 122 is a CMOS inverter with n=1 fuse inputs and m=0 data inputs, comprised of first and second nonvolatile memory elements nFET 124 and pFET 126 as shown. Use of the nonvolatile memory elements 124, 126 ensures that the logic gate 122 settles to and provides a predetermined output following application of a power supply source to the logic gate 122. To ensure proper logic-gate operation and to avoid static power consumption, the memory value of the nonvolatile memory elements 124, 126 (e.g., the floating-gate fg0 voltage) should be maintained near or above Vdd or near or below ground, to ensure that one of nFET 124 or pFET 126 is conducting and the other one is not, as is standard practice in CMOS logic. In the particular embodiment shown in FIG. 12C, logic gate 127 is a 2-input CMOS NAND with n=1 fuse inputs and m=1 data inputs. The floating gate of the one of the devices therein is designated fg0. Those of ordinary skill in the art will recognize how to construct multi-input logic gates of varying type and complexity given the examples provided by this disclosure.

Figure 13:
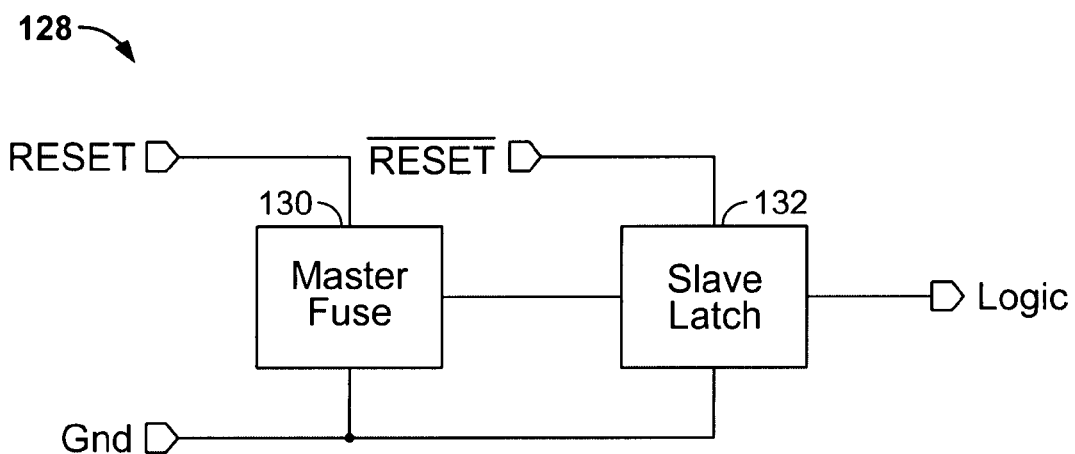
FIG. 13 shows a block diagram of a rewriteable master-slave electronic fuse, according to an embodiment of the present invention.

FIG. 13 shows a master-slave rewriteable electronic fuse 128, according to an embodiment of the present invention. The master-slave rewriteable electronic fuse 128 is used with logic (LOGIC) and comprises a master fuse 130 coupled to a slave latch 132. The master fuse 130 comprises a rewriteable electronic fuse, e.g., any one of the types described above, and is controlled by a master signal, (shown in FIG. 13 as RESET), applied to a master terminal of the master fuse 130. The slave latch 132 is controlled by a slave-latch signal (shown in FIG. 13 as $\overline{\text{RESET}}$), applied to the slave-latch terminal of the slave latch 132. Application of RESET causes the master fuse 130 to settle to a predetermined state as described above. After the master fuse 130 has settled to its predetermined state, $\overline{\text{RESET}}$ is applied to the slave-latch terminal of the slave latch 132 to latch and hold the state of the master fuse 130.

A benefit of using the master-slave rewriteable electronic fuse 128 shown in FIG. 13 is that it substantially avoids static power consumption, even for implementations where the master fuse 130 embodies one of the fuses described above which exhibit static power consumption. For example, one way that fuse embodiment 40 in FIG. 4 consumes power in a static (i.e. non-switching) state is if the floating-gate voltage, Vfg0, on the floating gate of the nonvolatile memory element 48 is not maintained near or above Vdd when nFET 44 is turned on. By configuring such a fuse (or any other fuse that may or may not consume static power) as a master fuse 130, and coupling it to a slave latch 132 as in FIG. 13, static power consumption can be avoided, regardless of the floating-gate voltage of any of the nonvolatile memory elements. This may be accomplished by latching the state of the master fuse 130 into the slave latch 132 after the master fuse 130 has had time to settle to its predetermined state, and at the same time (or shortly thereafter) powering down the master fuse 130. With reference to the master-slave fuse embodiment 128 in FIG. 13, this is performed by first applying the RESET power signal to the master fuse 130. Following the master fuse 130 settling to its predetermined state, the $\overline{\text{RESET}}$ power signal is applied to the slave latch 132 to latch in the state of the master fuse 130. Because RESET and $\overline{\text{RESET}}$ are inverses in this exemplary embodiment, the master fuse 130 is powered down as the slave latch 132 powers up and latches in the state of the master fuse 130. With RESET powered down, master fuse 130 cannot consume static power. Another benefit of using a master-slave fuse 128 is to ensure data reliability, as follows: Take RESET and $\overline{\text{RESET}}$ to be periodic signals (of opposing phase), with first the master fuse powered, then second the slave latch, then third the master fuse, then fourth the slave latch, ad infinitum. If the slave latch loses data, as may happen, for example, from a glitch on RESET or from a cosmic particle striking the latch, it reloads its data from the master fuse on the next period of the $\overline{\text{RESET}}$ signal.

Figure 14:
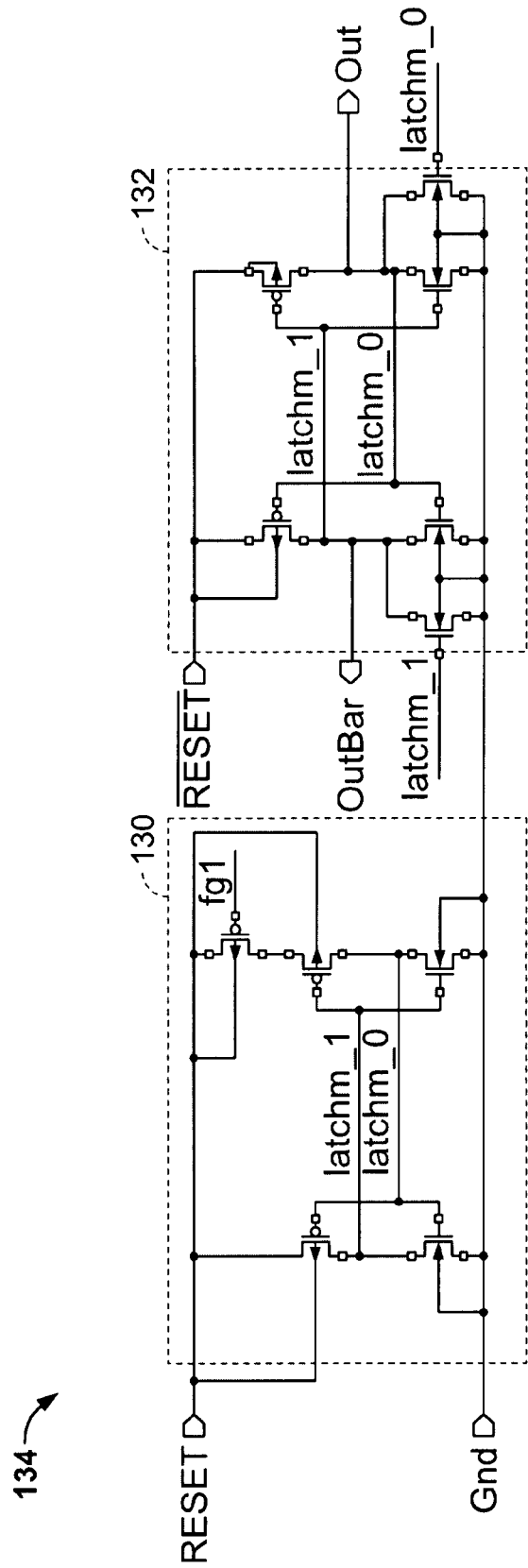
FIG. 14 shows a schematic diagram of an exemplary master-slave electronic fuse having a self-latching, rewriteable asymmetric serial fuse similar to that shown in FIG. 9, according to an embodiment of the present invention.

FIGS. 14–17 show some exemplary implementations of various master-slave rewriteable electronic fuses, according to embodiments of the present invention. FIG. 14 shows how the asymmetrical fuse 94 in FIG. 9 may be used to implement the master fuse 130 of the master-slave rewriteable electronic fuse 128 shown in FIG. 13. The master fuse 130 includes a master signal terminal configured to receive a Reset power signal. A slave latch 132 is coupled to the master fuse 130 and has a slave-latch terminal configured to receive a slave-latch signal, e.g., a $\overline{\text{RESET}}$ power signal as shown in FIG. 14. The master fuse 130 provides first and second output signals, latchm_1 and latchm_0, which are coupled to inputs of the slave latch 132 as shown in the drawing. Those of ordinary skill in the art will now readily understand that, whereas a two-output master latch and a two-input slave latch are shown in FIG. 14, other master fuses and slave latches could be used, for example, master fuses with only a single output and slave latches with a single input.

Figure 15:
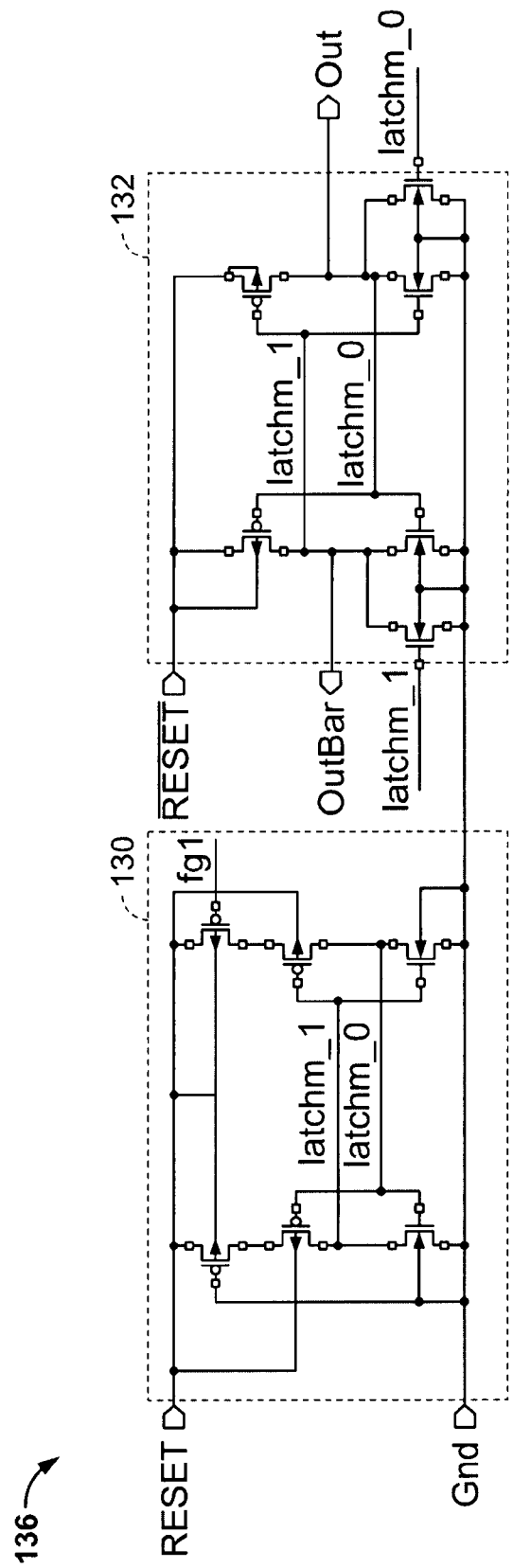
FIG. 15 shows a schematic diagram of an exemplary master-slave electronic fuse having a self-latching, rewriteable symmetric serial fuse similar to that shown in FIG. 7, according to an embodiment of the present invention.

FIG. 15 shows how the symmetrical fuse 72 in FIG. 7 may be used to implement the master fuse 130 of the master-slave rewriteable electronic fuse 128 shown in FIG. 13. Similar to the master-slave fuse 134 in FIG. 14, the master fuse 130 in the master-slave fuse 136 in FIG. 15 includes a master signal terminal configured to receive a Reset power signal. A slave latch 132 is coupled to the master fuse 130 and has a slave-latch terminal configured to receive a slave-latch signal, e.g., a $\overline{\text{RESET}}$ power signal as shown in FIG. 15. Also similar to the master-slave rewriteable electronic fuse in FIG. 14, the master fuse 130 in the master-slave rewriteable electronic fuse 136 in FIG. 15 provides first and second latch output signals, latchm_1 and latchm_0, which are coupled to inputs of the slave latch 132 as shown in the drawing.

Figure 16:
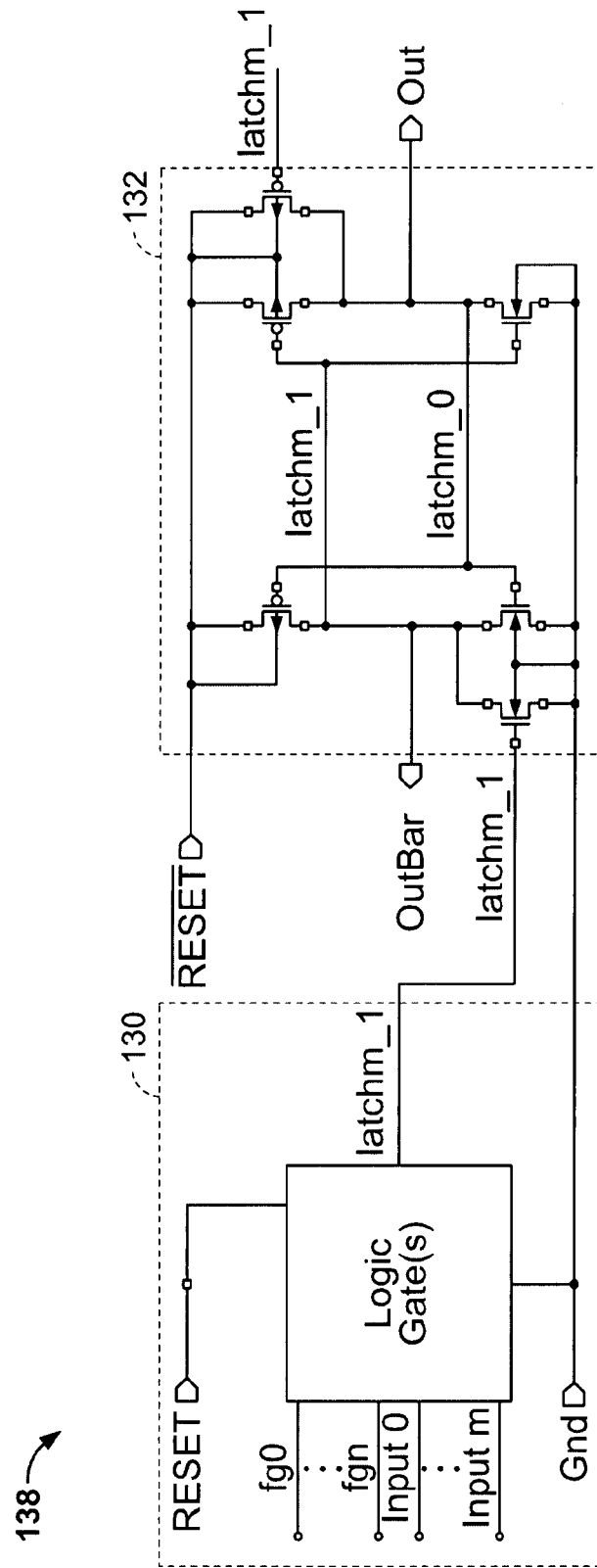
FIG. 16 shows a schematic diagram of an exemplary master-slave electronic fuse having a logic-gate fuse similar to the logic-gate fuse shown in FIG. 12A, according to an embodiment of the present invention.
Figure 17:
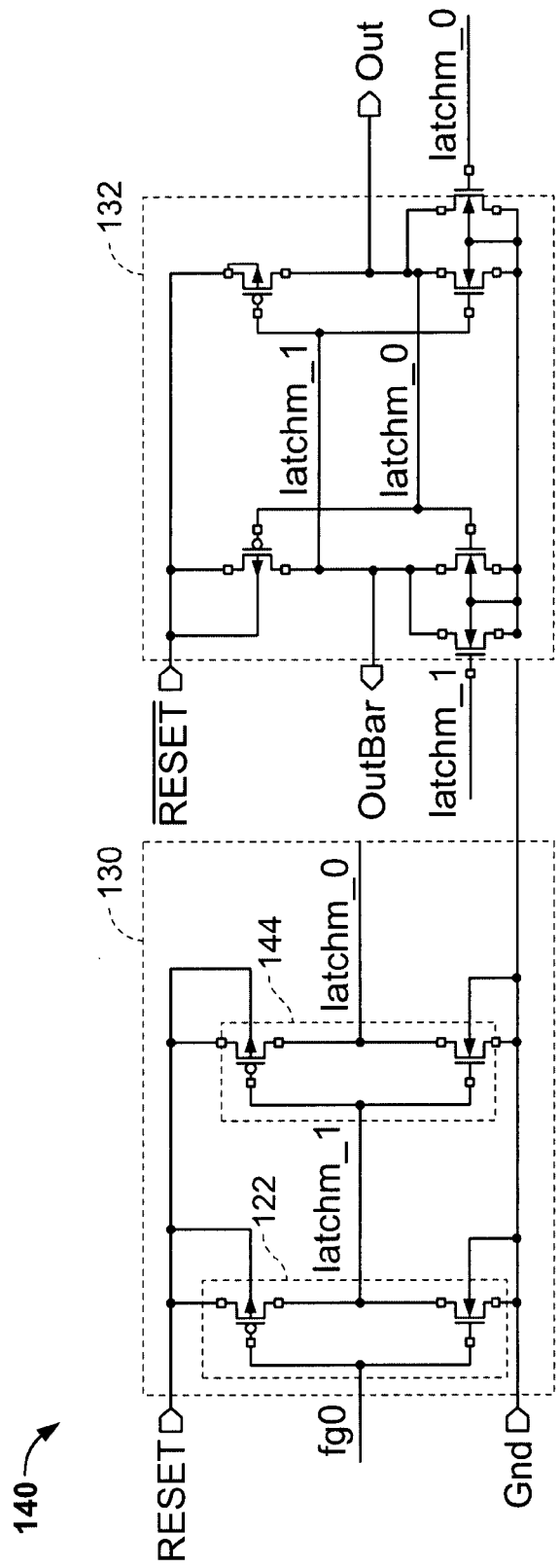
FIG. 17 shows a schematic diagram of an exemplary master-slave electronic fuse having a logic-gate fuse similar to the logic-gate fuse shown in FIG. 12B, and a non-floating-gate logic gate, according to an embodiment of the present invention.

FIG. 16 shows how the generic logic-gate fuse 121 in FIG. 12A may be used to implement the master fuse 130 of the master-slave rewriteable electronic fuse 128 shown in FIG. 13. The master fuse 130 provides a latch output signal, latchm_1, which is coupled to the slave latch 132 as shown in the drawing. FIG. 17 shows a specific rewriteable logic-gate master-slave fuse 140 that utilizes two inverters 122 and 144 connected in series. The first inverter 122 is the logic-gate fuse shown in connection with FIG. 12B. The second inverter 144 is configured to receive a first latch output signal, latchm_1, from the first inverter 122 and provide a second latch output signal, latchm_0. As shown in FIG. 17, the first and second latch output signals, latchm_1 and latchm_0, are coupled to inputs of the slave latch 132.

Similar to the master-slave fuses 134, 136 in FIGS. 14 and 15, the master-slave logic-gate fuses 138, 140 in FIGS. 16 and 17 have a master signal terminal coupled to their respective master fuse. The master signal terminal is configured to receive a $\overline{\text{RESET}}$ power signal. The master-slave fuses 138, 140 in FIGS. 16 and 17 also include a slave latch 132, which is coupled to the master fuse 130, and is configured to receive a slave-latch signal (e.g., a RESET power signal) at its respective slave-latch terminal. The master fuse 130 in FIG. 17 provides first and second output signals latch m0 and latch m1 which are coupled to input of the slave latch 132 as shown.

Whereas FIGS. 14–17 illustrate a few specific implementations of what may comprise the master fuse 130 in the master-slave rewriteable electronic fuse shown in FIG. 13, any of the rewriteable electronic fuses described in this disclosure may be used to implement the master fuse 130. Further, whereas the slave latch 132 is shown to have a particular embodiment in the master-slave rewriteable electronic fuses shown in FIGS. 14–17, those of ordinary skill in the art will readily appreciate and understand that other latch types and configurations could be used for the slave latch 132 and, therefore, the slave latch type used in FIGS. 14–17 is merely exemplary.

Figure 18:
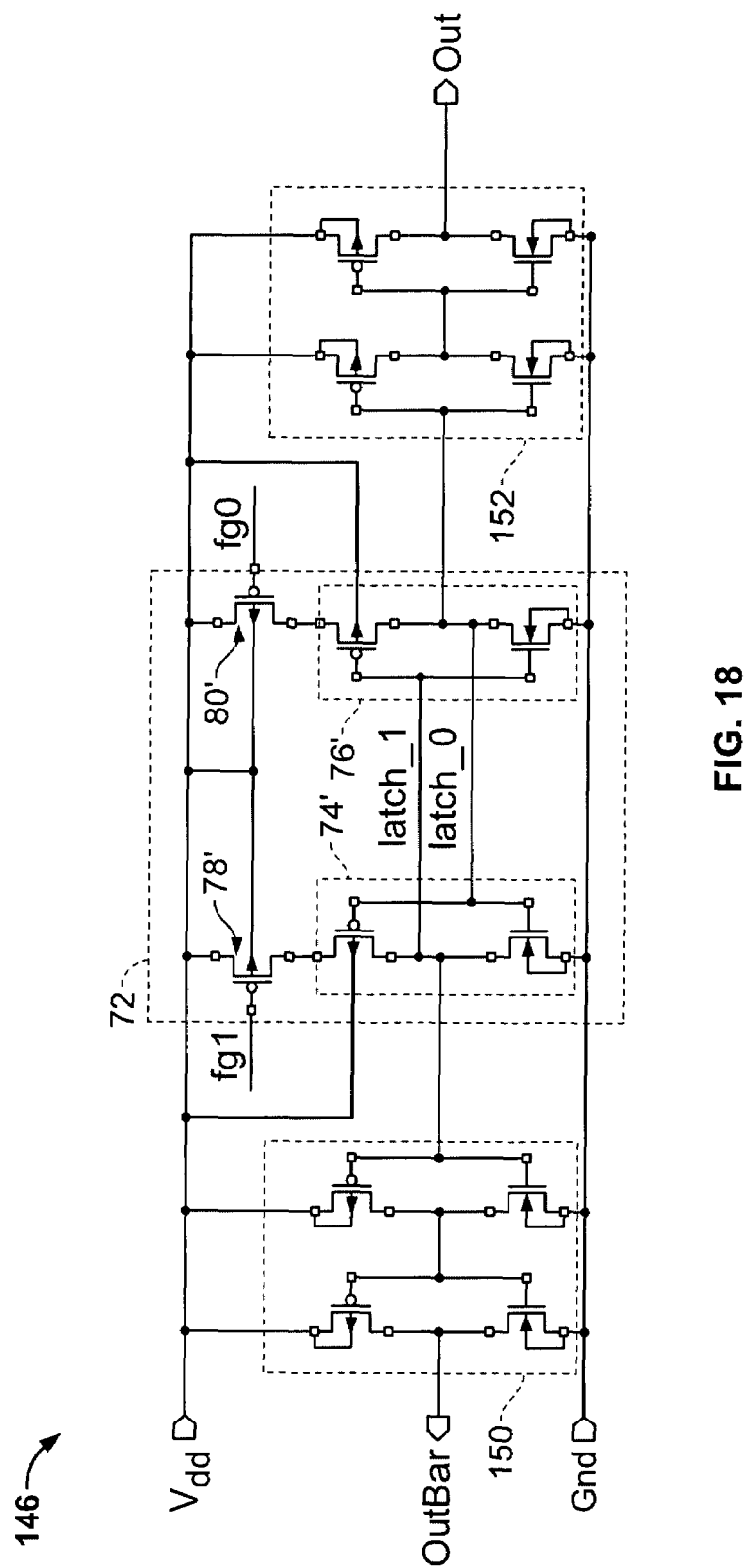
FIG. 18 shows a schematic diagram of an exemplary self-latching, rewriteable electronic fuse that includes a symmetric serial fuse similar to that shown in FIG. 7, and buffering circuits for preventing load-induced bit errors, according to an embodiment of the present invention.

Referring now to FIG. 18, there is shown a rewriteable electronic fuse circuit 146 that includes a rewriteable electronic fuse 72 from FIG. 7, and buffering circuits 150 and 152 coupled to the fuse 72 outputs, in accordance with an embodiment of the present invention. The fuse 72 comprises a pair of cross-coupled CMOS inverters 74', 76', with the output latch 1 of inverter 74' being coupled to the input of inverter 76', and the output latch 0 of inverter 76' being coupled to the input of inverter 74'. The two non-volatile memory elements 78' and 80' have floating gates fg1 and fg0, respectively. The buffering circuits 150, 152 help prevent load-induced errors. For example, referring to fuse 72 in FIG. 7, a capacitive load on Out, such as might arise from another circuit connected to Out, could cause Out to rise more slowly than OutBar at power-up, and could cause fuse 72 to settle to an incorrect state. Buffering circuits 150, 152 in FIG. 18 isolate external loads from fuse 72, thereby helping to ensure that fuse 72 settles to the correct state at power-up. Buffering circuits 150, 152 likewise help prevent fuse 72 from being driven to an incorrect state by glitches on external load circuits connected to Out or Outbar. Whereas each fuse output in FIG. 18 is shown to be double-buffered (two inverters connected in series), those of ordinary skill in the art will now readily understand that other types of buffering (e.g., single, triple, other gate types, etc.) may be used. Further, whereas fuse buffering is shown in FIG. 18 as being applied to symmetrical serial fuse (e.g., of the type shown in FIG. 7), the fuse buffering aspect of the present invention may also be used with other of the fuse types described in this disclosure.

Figure 19:
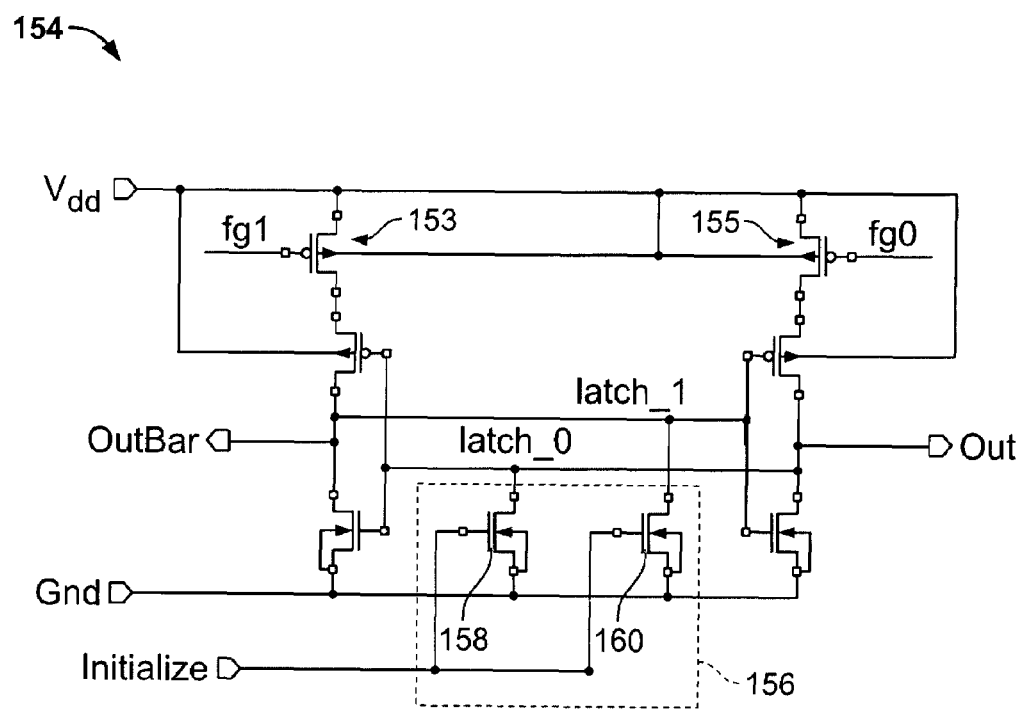
FIG. 19 shows a schematic diagram of an exemplary self-latching, rewriteable electronic fuse that includes an initialization circuit, according to an embodiment of the present invention.

FIG. 19 shows a rewriteable electronic fuse 154 having an initialize circuit 156, according to an embodiment of the present invention. The fuse 154 includes non-volatile memory elements 153 and 155 having floating gates fg1 and fg0, respectively. The initialize circuit 156 includes first and second nFET switches 158 and 160, which have gates coupled to a an initialize signal terminal and sources coupled to Gnd. The drain of the first nFET switch 158 is coupled to a first latch terminal, latch_0, and the drain of the second nFET switch 160 is coupled to a second latch terminal, latch_1. Applying the initialize signal causes the initialize circuit 156 to drive latch terminals latch_0 and latch_1 to Gnd; releasing the initialize signal allows latch terminals latch_0 and latch_1 in fuse 154 to re-settle to a predetermined output. Initialize circuit 156 can be used (1) before power-up, to ensure that latch_0 and latch_1 are discharged prior to power-up; (2) during power-up, to hold latch_0 and latch_1 at ground until Vdd is stable and noise free; (3) after power-up, to cause fuse 154 to reset if the power-up was noisy or had glitches; or (4) periodically, to ensure that fuse 154 reloads its data periodically and thereby corrects errors due to noise or cosmic particles that upset the latch state. Whereas the initialize circuit 156 in FIG. 19 is shown as being applied to a symmetrical serial fuse (e.g., of the type shown in FIG. 7 above), those of ordinary skill in the art will now readily appreciate and understand that the initialize circuit aspect of the present invention may also be used with other of the fuse types described in this disclosure. Likewise, those of ordinary skill in the art will readily appreciate and understand that any mechanism employed to initialize an electronic fuse, such as using pFETs rather than nFETs for the initializing transistors, or initializing latch_0 and latch_1 to Vdd rather than to Gnd, or temporarily shorting latch_0 and latch_1 together using transistors, or a range of other possibilities, is within the spirit and scope of this aspect of the present invention.

Figure 20:
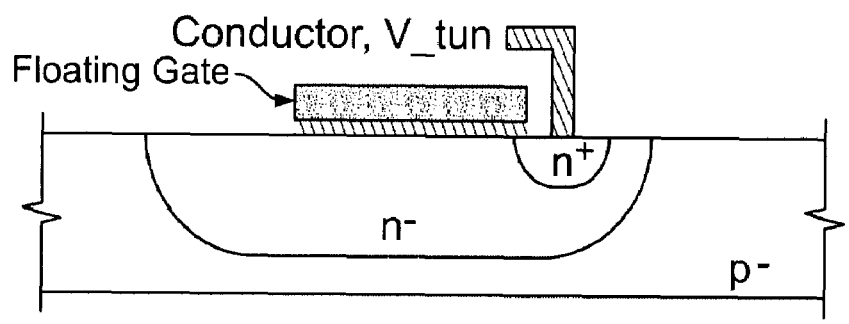
FIG. 20 shows a cross-sectional diagram of a MOS tunneling capacitor, which may be used to control the amount of charge resident on a floating gate of a floating-gate transistor used to implement a nonvolatile memory element.
Figure 21:
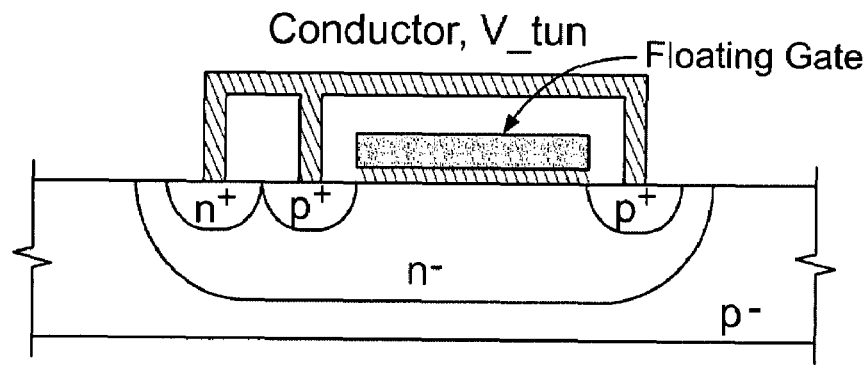
FIG. 21 shows a cross-sectional diagram of a pFET tunneling capacitor, which may be used to control the amount of charge resident on a floating gate of a floating-gate transistor used to implement a nonvolatile memory element.

As described above in relation to FIGS. 5A–5F, the nonvolatile memory elements used in the various fuse embodiments of the present invention may comprise floating-gate transistors. The amount of charge stored on the floating gate of such a floating-gate transistor determines the memory value (i.e. the floating-gate voltage) of the floating-gate transistor. Adding electrons to or removing electrons from the floating gate can modify this memory value. Accordingly, the predetermined state to which a fuse settles following a power-up or a reset of the fuse can be controlled and varied (i.e. can be written and rewritten) by adjusting the charge on the floating gate. One way of adjusting the charge resident on the floating gate of a floating-gate transistor is to connect a tunneling junction to the floating gate, and to tunnel electrons through the insulator that forms the tunneling junction using standard Fowler-Nordheim or direct-tunneling mechanisms. A tunneling junction can be implemented in various ways. For example, a MOSCAP tunneling junction may be formed using a MOS capacitor 162, as shown in FIG. 20. This tunneling junction includes V tun conductor terminal and a floating gate. The junction is comprises p– substrate in which is formed an n– well having a n+ region coupled to the V tun conductor terminal. As another example, the tunneling junction may be a DFET tunneling junction formed using a shorted pFET 164, as shown in FIG. 21. In this tunneling junction, n+ and p+ regions provided in an n– well disposed in a p– substrate are shorted together as shown, including the V tun conductor terminal. Indeed, any capacitor structure, irrespective of the device from which it is formed may be used, as those of ordinary skill in the art will now readily appreciate and understand.

Figure 22:
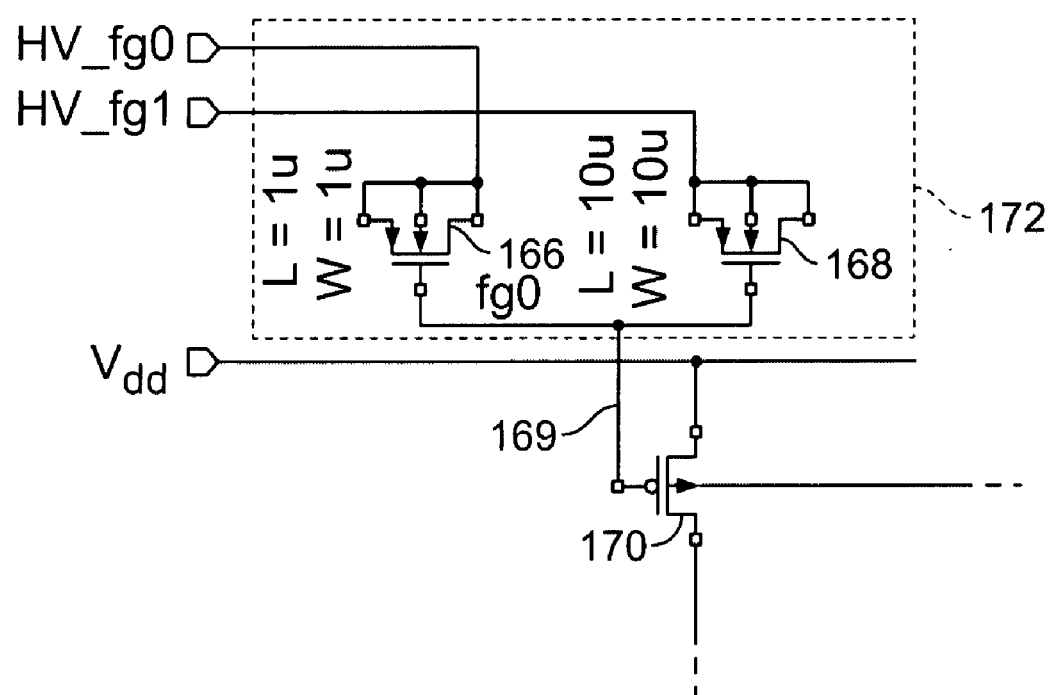
FIG. 22 shows a partial schematic diagram of a self-latching, rewriteable asymmetric fuse, illustrating how first and second tunneling capacitors may be used to control the amount of charge resident on the floating gate of a floating-gate transistor used to implement the nonvolatile memory element of the fuse, according to an embodiment of the present invention.

FIG. 22 shows how first and second tunneling capacitors 166 and 168 coupled to the floating-gate transistor of an asymmetrical fuse (e.g., of the type shown in FIG. 9 above) may be used to control the amount of charge (and, consequently, the memory value) resident on the floating gate 169 of the asymmetric fuse's floating-gate transistor 170. Note that only the nonvolatile memory element 170 of the asymmetric fuse is shown in FIG. 22, it being understood that the remainder of the fuse is embodied as described in the manner above (e.g., see FIG. 9 above). The first tunneling capacitor 166 has smaller dimensions (gate length=gate width=one unit) than second tunneling capacitor 168 (gate length=gate width=ten units), and, hence, has a capacitance that is also smaller (e.g., one-hundred times smaller in the example shown in FIG. 22, by using shorted pFETs with gate areas that differ by a factor of one-hundred). The gates of both the first and second tunneling capacitors 166, 168, are both connected to floating gate 169 of the floating-gate transistor 170. Hence the gates of each of the first and second tunneling capacitors 166, 168 serve as first capacitor plates. The opposing plate of the first tunneling capacitor 166, which in this example is formed by the shorted drain, source and body terminals of the first tunneling capacitor 166, is coupled to a first high-voltage terminal, HV_fg0. Similarly, the opposing plate of the second tunneling capacitor 168, which in this example is formed by the shorted drain, source and body terminals of the second tunneling capacitor 168, is coupled to a second high-voltage terminal, HV_fg1. Together the first and second tunneling capacitors 166, 168 comprise a bidirectional tunneling control circuit 172.

In accordance with an aspect of the present invention, a bidirectional tunneling technique is used to modify and control the amount of charge stored on the floating gate 169 of the floating-gate transistor 170 in FIG. 22. According to this technique, the floating gate 169 may be "tunneled up" so that it has a higher floating-gate voltage or "tunneled down" so that it has a lower floating-gate voltage. To tunnel the floating gate 169 up, the second high-voltage terminal, HV_fg1, may be connected to ground. Then a first high-voltage power supply (approximately ten volts in the case of pFETs with 70 Å gate oxides) is connected to the first high-voltage terminal, HV_fg0. Because the first and second tunneling capacitors 166, 168 are connected in series between the first high-voltage power supply and ground, the first high-voltage power-supply voltage is divided across the two tunneling capacitors 166, 168. Most of the voltage will drop across the first tunneling capacitor 166, however, because it has a smaller capacitance than the second tunneling capacitor 168, so the floating-gate voltage 169 will be closer to ground than to the first high-voltage supply. Under this bias configuration, electrons are tunneled from the floating gate 169 to the first high-voltage supply by Fowler-Nordheim tunneling. Eventually the voltage on floating gate 169 will tunnel up until the Fowler-Nordheim tunneling current becomes small. After this occurs, the first high-voltage terminal, HV_fg0, may be disconnected from the first high-power voltage supply and dropped to ground potential. The result is a higher floating-gate voltage than before the tunneling operation.

To tunnel the floating gate 169 down, the first high-voltage terminal, HV_fg0, is connected to ground. Then a second high-voltage power supply (approximately ten volts in the case of pFETs with 70 Å gate oxides) is connected to the second high-voltage terminal, HV_fg1. Because the second and first tunneling capacitors 168, 166 are connected in series between the second high-voltage power supply and ground, the second high-voltage power supply voltage is divided across the two tunneling capacitors 168 and 166. Most of the voltage will drop across the first tunneling capacitor 166, however, because it has a smaller capacitance than the second tunneling capacitor 168, so the floating-gate voltage 169 will be closer to the second high-voltage supply than to ground. Under this bias configuration, electrons are tunneled from ground onto the floating gate 169 by Fowler-Nordheim tunneling. Eventually the voltage on floating gate 169 will tunnel down until the Fowler-Nordheim tunneling current becomes small. After this occurs, the second high-voltage terminal, HV_fg1, is disconnected from the second high-power voltage supply and dropped to ground potential. The result is a lower floating-gate voltage than before the tunneling operation, because the electron tunneling direction (i.e. onto the floating gate 169) is opposite to the direction used to tunnel the floating gate 169 up as described above. Hence the term "bidirectional" tunneling.

Figure 23:
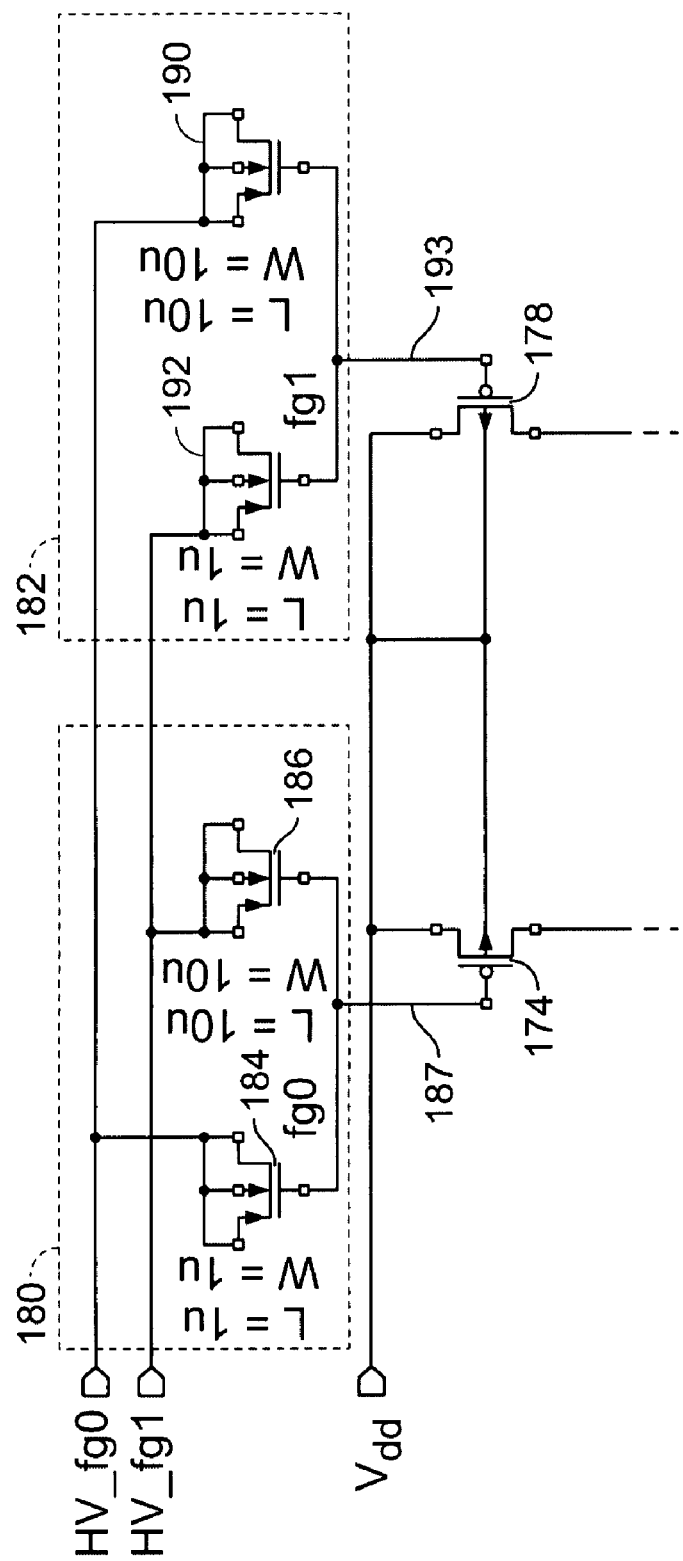
FIG. 23 shows a partial schematic diagram of a self-latching, rewriteable symmetric fuse, illustrating how first and second tunneling capacitors may be used to add charge to the floating gate of a first floating-gate transistor, and how conversely third and fourth tunneling capacitors may be used to remove charge from the floating gate of a second floating-gate transistor, according to an embodiment of the present invention.

The bidirectional tunneling technique described above can be applied individually to any of the floating-gate memory elements used in any of the fuse embodiments described above. While individual application may be performed, more than one floating-gate memory element can, nevertheless, be programmed at the same time. FIG. 23 shows, for example, how two floating-gate voltages (i.e. memory values) of the floating-gate elements in a symmetric fuse may be modified at the same time. Note that only the floating-gate memory elements 174 and 178 of the symmetric fuse are shown in FIG. 23, it being understood that the remainder of the fuse is embodied as described in the manner above (e.g., see FIG. 7 above). According to this embodiment of the present invention, first and second floating-gate transistors 174 and 178 are coupled to respective first and second bidirectional tunneling control circuits 180 and 182 via floating gates 187 and 193, respectively. The first bidirectional tunneling control circuit 180 includes a small tunneling capacitor 184 and a large tunneling capacitor 186, in a manner similar to the bidirectional tunneling control circuit described in FIG. 22. The small tunneling capacitor 184 of the first bidirectional tunneling control circuit 180 has a first plate coupled to the floating gate fg0 187 of the first floating-gate transistor 174, and an opposing (i.e. second) plate coupled to a first high-voltage terminal, HV_fg0. The large tunneling capacitor 186 of the first bidirectional tunneling control circuit 180 has a first plate coupled to the floating gate fg0 187 of the first floating-gate transistor 174 and an opposing (i.e. second) plate coupled to a second high-voltage terminal, HV_fg1. The second bidirectional tunneling control circuit 182 also includes large and small tunneling capacitors 190 and 192. The small tunneling capacitor 192 of the second bidirectional tunneling control circuit 182 has a first plate coupled to the floating gate fg1 193 of the second floating-gate transistor 178, and an opposing (i.e. second) plate coupled to the second high-voltage terminal, HV_fg1. The large tunneling capacitor 190 of the second bidirectional tunneling control circuit 182 has a first plate coupled to the floating gate fg1 193 of the second floating-gate transistor 178 and an opposing (i.e. second) plate coupled to the first high-voltage terminal, HV_fg0.

Notice that the second plate of the small capacitor 184 in the first bidirectional tunneling control circuit 180 in FIG. 23 is coupled to the first high-voltage terminal, HV_fg0, but the second plate of the small capacitor 192 in the second bidirectional tunneling control circuit 182 is coupled to the second high-voltage terminal, HV_fg1. Also notice that the second plate of the large capacitor 186 in the first bidirectional tunneling control circuit 180 is coupled to the second high-voltage terminal, HV_fg1, but the second plate of the large capacitor 190 in the second bidirectional tunneling control circuit 182 is coupled to the first high-voltage terminal, HV_fg0. Applying the bidirectional tunneling technique described in relation to FIG. 22 to the tunneling junctions in FIG. 23 allows the floating gate 187 of the first floating-gate transistor 174 to be tunneled up, while at the same time the floating gate 193 of the second floating-gate transistor 178 to be tunneled down, or vice versa.

Figure 24:
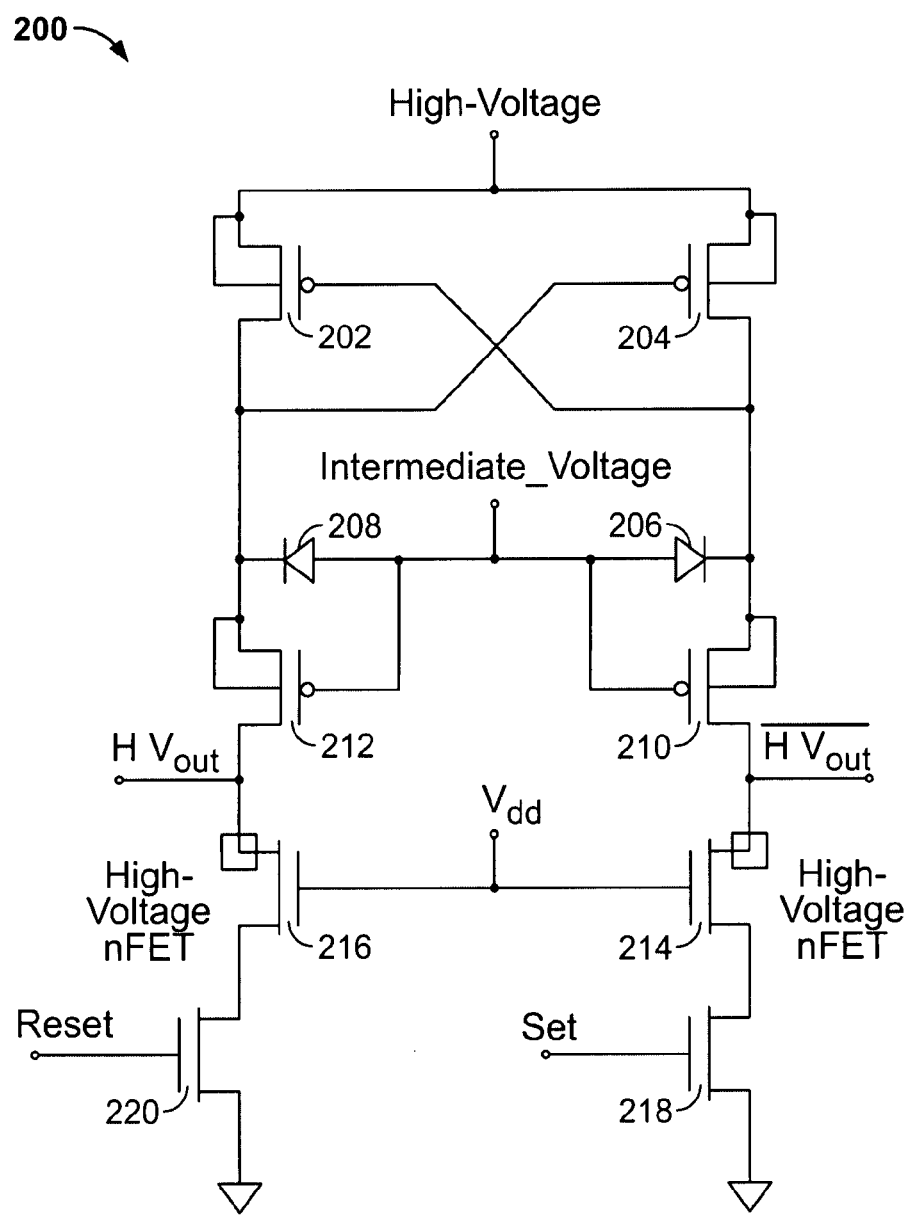
FIG. 24 shows an exemplary high-voltage switching circuit, one or more of which may be used to supply the high voltages necessary to affect the bidirectional tunneling aspect of the present invention.

FIG. 24 shows a high-voltage switching circuit 200, one or more of which may be used to supply the high voltages to the first and second high-voltage terminals in FIGS. 22 and 23, according to an embodiment of the present invention. The high-voltage switching circuit 200 provides a differential high-voltage output signal, HVout and $\overline{\text{HVout}}$, in response to two complementary logic-level states applied to logic-level input nodes, Reset and Set, and a high-voltage supply input. The high-voltage switching circuit 200 includes first and second pFETs 202 and 204 having cross-coupled gates and drains, and sources coupled to a high-voltage supply node, High-Voltage. A first diode 206 is coupled between an intermediate voltage node, Intermediate_Voltage, and the drain of the second pFET 204. A second diode 208 is coupled between the intermediate voltage node, Intermediate_Voltage, and the drain of the first pFET 202. Third and fourth pFETs 210 and 212 have their gates both coupled to the intermediate voltage node, Intermediate_Voltage, and their sources coupled to the cathodes of the first and second diodes 206, 208, respectively. The drains of the third and fourth pFETs 210, 212 embody the first and second output voltage nodes, $\overline{\text{HVout}}$ and HVout, respectively. First and second high-voltage cascode nFETs 214 and 216 have their gates coupled to a power-supply terminal, Vdd, their sources coupled to the drains of third and fourth nFETs 218 and 220, respectively, and their drains coupled to the first and second output voltage nodes, $\overline{\text{HVout}}$ and HVout. Third and fourth nFETs 218 and 220 are configured so that their sources are coupled to ground, and their drains are coupled to the sources of the third and fourth high-voltage nFETs 214, 216. The gates of the third and fourth nFETs 218, 220 embody the logic-level input nodes, Set and Reset, respectively.

The high-voltage switching circuit 200 shown in FIG. 24 can be manufactured in a standard n– well CMOS process, with the high-voltage nFETs 214, 216 comprising, for example, Lateral-Diffused Metal-Oxide Semiconductor nFETs (LDMOS nFETs) or Drain Extended MOS nFETs (DEMOS nFETs). LDMOS and DEMOS nFETs, unlike pFETs fabricated in standard n– well CMOS processes, can handle drain-to-source and drain-to-gate voltages that are much larger than the rated supply voltage for a given process (e.g., greater than 3.3V for a 3.3V CMOS process). Accordingly, their use, together with their cascode configuration in FIG. 24, allows the switching of high-voltages to be performed without the risk of transistor damage. In this circuit, the voltage applied to the high-voltage supply node, High-Voltage, may be about 10V, the intermediate voltage applied to the intermediate voltage node, Intermediate_Voltage, may be about 6V, and Vdd may be about 3.3V, although these numbers can be varied depending on the application. Using this biasing arrangement, the high-voltage switching switch generates a voltage of HVout=10V and $\overline{\text{HVout}}$=0V or vice versa, depending on the logic values applied to the logic-level input nodes, Reset and Set.

It should be emphasized that the high-voltage switching circuit 200 in FIG. 24 is only exemplary and is not disclosed with the intent to limit the various embodiments of the present invention in any way. Indeed, those of ordinary skill in the art will readily appreciate and understand that the high-voltage switching circuit 200 shown in FIG. 24 is but one example of many possible high-voltage switching circuits which may be applied to perform the bidirectional tunneling technique described above, and/or the other of the floating-gate charge-modifying approaches described in this disclosure which require the application of high voltages. Other embodiments such as those shown in co-pending U.S. patent application Ser. No. 10/814,867, filed on Mar. 30, 2004, which is now U.S. Pat. No. 7,145,370, may also be used. Said application is hereby incorporated herein by reference as if set forth fully herein.

Figure 25:
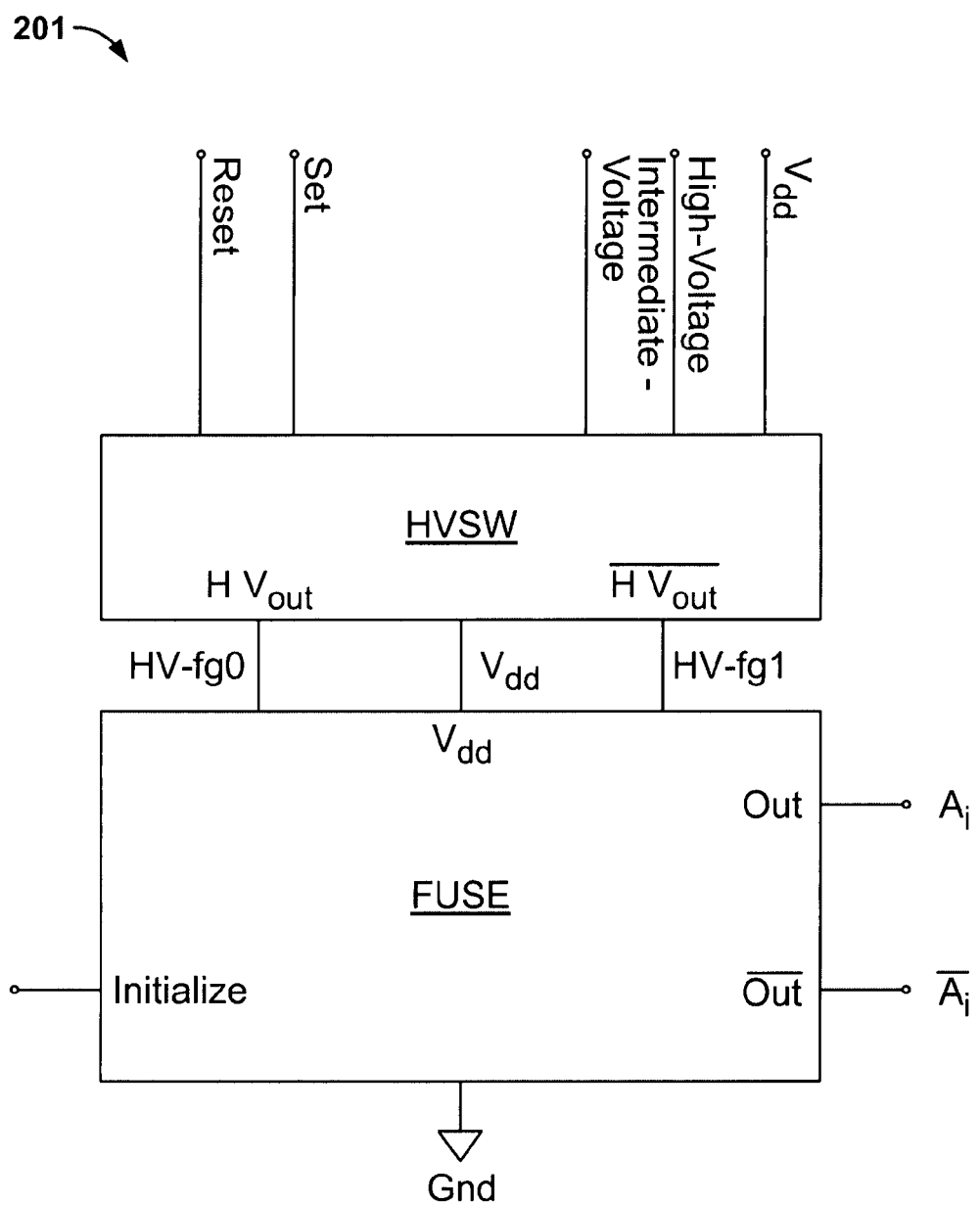
FIG. 25 shows a block diagram illustrating how a high-voltage switching circuit similar or equivalent to the high-voltage switching circuit shown in FIG. 24 may be coupled to a rewriteable electronic fuse such as shown in FIG. 28, according to an embodiment of the present invention.

FIG. 25 shows a block diagram of a bit cell 201 which combines a high-voltage switch (HVSW) such as that illustrated in FIG. 24 with the rewriteable electronic fuse of FIG. 19. High-voltage switch HVSW has output HVout connected to the first high voltage terminal HV fg0 of the fuse and output $\overline{\text{HVout}}$ connected the second high voltage terminal HV fg1 of the fuse. Those of ordinary skill in the art will now realize that other combinations of switches and fuses could also be used as desired in response to the goals of the designer. Bit cell 201 has as inputs in the configuration shown, the logical input signals, Set and Reset, and Initialize; and the voltage signals Vdd, Gnd, High-Voltage and Intermediate-Voltage. Bit cell 201's outputs are Out (Ai) and $\overline{\text{Out}}$ (OutBar) $(\overline{\text{Ai}})$. In other configurations bit cell 201 may have more or fewer inputs and/or outputs as will now be apparent to those of ordinary skill in the art. Bit cell 201 is intended to be exemplary only to show how such cells may be arranged in the figures that follow and thus shouldn't be read to limit in any way the scope of the claims.

Figure 26:
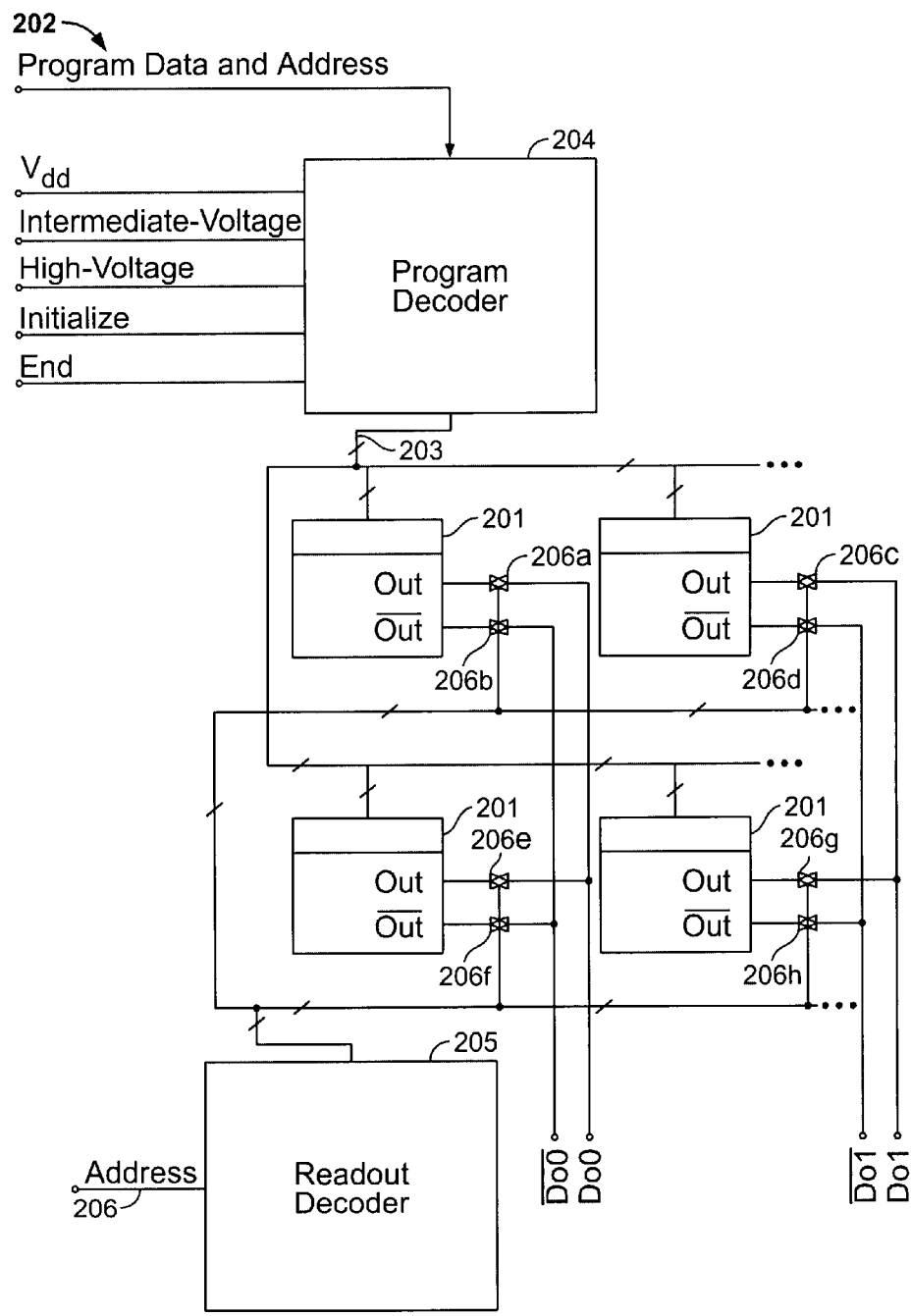
FIG. 26 shows a diagram of an exemplary plurality of rewriteable electronic fuse structures and how their combination may be configured to provide a rewriteable electronic fuse array, according to an embodiment of the present invention.

FIG. 26 illustrates one type of array 202 of bit cells 201 such as those illustrated in FIG. 25. The signals Vdd, Gnd, Intermediate-Voltage, High-voltage, Initialize, Program Data (applied to the Set/Reset inputs) and Address are carried on the signal bus 203 as illustrated to the various elements 201 of the bit cell array 202. A program decoder 204 responsive to the Address input is used in this embodiment to direct the signals Vdd, Gnd, Intermediate-Voltage, High-Voltage, Initialize and Program Data to the one or more bit cells for programming or initialization. Such decoders are well known to those of ordinary skill in the art and will not be further described herein to avoid over-complicating this disclosure. A read out decoder 205 responsive to an Address signal input 206 is used to select the one or more bit cells to be read on the Out lines DO0/$\overline{\text{DO0}}$, DO1/$\overline{\text{DO1}}$, etc. Pass gates 206a, 206b, 206c 206d, 206e, 206f, 206g, 206h may be used if desired to control which row (in this embodiment) will be read out of the columns at a given instant.

Figure 27:
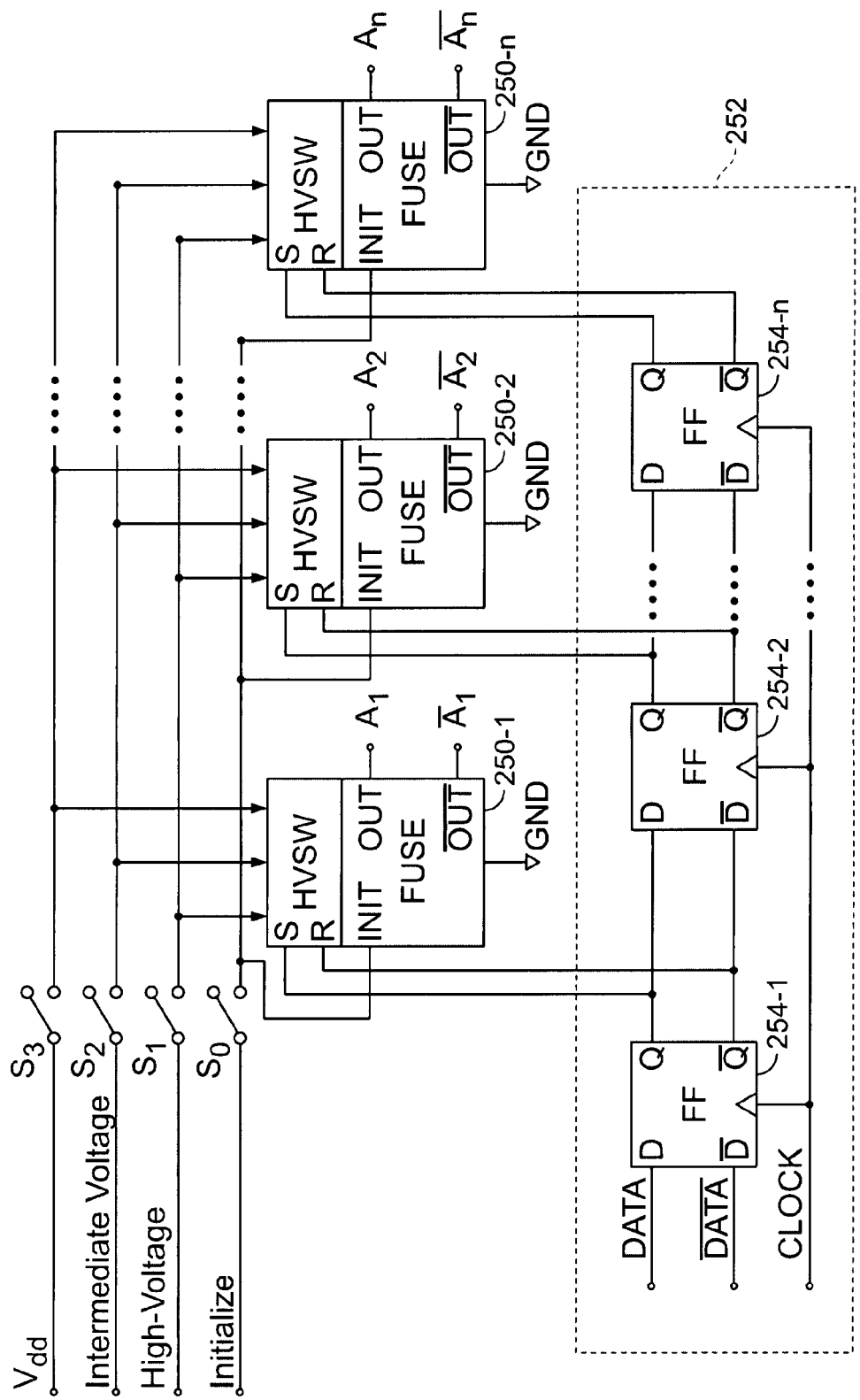
FIG. 27 shows a schematic diagram of an exemplary plurality of rewriteable electronic fuse structures and how their combination may be distributed in an irregular but predetermined configuration, according to an embodiment of the present invention.

Whereas FIG. 26 shows a plurality of bit cells (like bit cell 201 in FIG. 25) disposed in an array pattern, other embodiments of the present invention allow a plurality of bit cells to be distributed in an irregular but predetermined configuration (i.e. in a non-array configuration). FIG. 27 shows an exemplary embodiment of such a plurality of bit cells 250-1, 250-2, . . . , 250-n (n is an integer greater than or equal to two), which are distributed in a possibly irregular but predetermined configuration. A shift register 252, comprised of a plurality of flip-flops (FF) 254-1, 254-2, . . . , 254-n, is coupled to the plurality of bit cells 250-1, 250-2, . . . , 250-n as shown. Programming bits are loaded into the shift register 252 via a data line (shown as DATA and $\overline{\text{DATA}}$ and labeled D and D, respectively, in the figure) in response to a CLOCK signal applied to clock inputs of the flip-flops 254-1, 254-2, . . . , 254-n. The outputs (Q, $\overline{\text{Q}}$) of the plurality of flip-flops 254-1, 254-2, . . . , 254-n are coupled as shown to the plurality of bit cells 250-1, 250-2, . . . , 250-n. After all programming bits have been shifted into the flip-flops 254-1, 254-2, . . . , 254-n of the distributed shift register 252, a primary High-Voltage switch S1 (as well as an Intermediate-Voltage switch S2, and Vdd switch S3) is closed to connect a High-Voltage power supply, HV, to the high-voltage input terminals of the plurality of bit cells 250-1, 250-2, . . . , 250-n. An initialize terminal is provided at S0. Application of the High-Voltage power supply to the high-voltage input terminals of the bit cells 250-1, 250-2, . . . , 250-n causes the memory values (e.g., the floating-gate voltages of floating-gate transistors embedded in the bit cell) to be set to the programming values resulting in predictable outputs at $A_1$, $\overline{A_1}$; $A_2$, $\overline{A_2}$ . . . $A_n$, $\overline{A_n}$. Using a high voltage to modify the bit-cell memory values (i.e. the floating-gate voltages of the floating-gate transistors) was described in detail above (see, for example, the bidirectional tunneling discussion in connection with FIGS. 22 and 24). After the memory values have been set to a predetermined level, each of the plurality of fuses settles to a predetermined state following a power-up or reset of the fuse, in manner that has been described in detail above.

Figure 28:
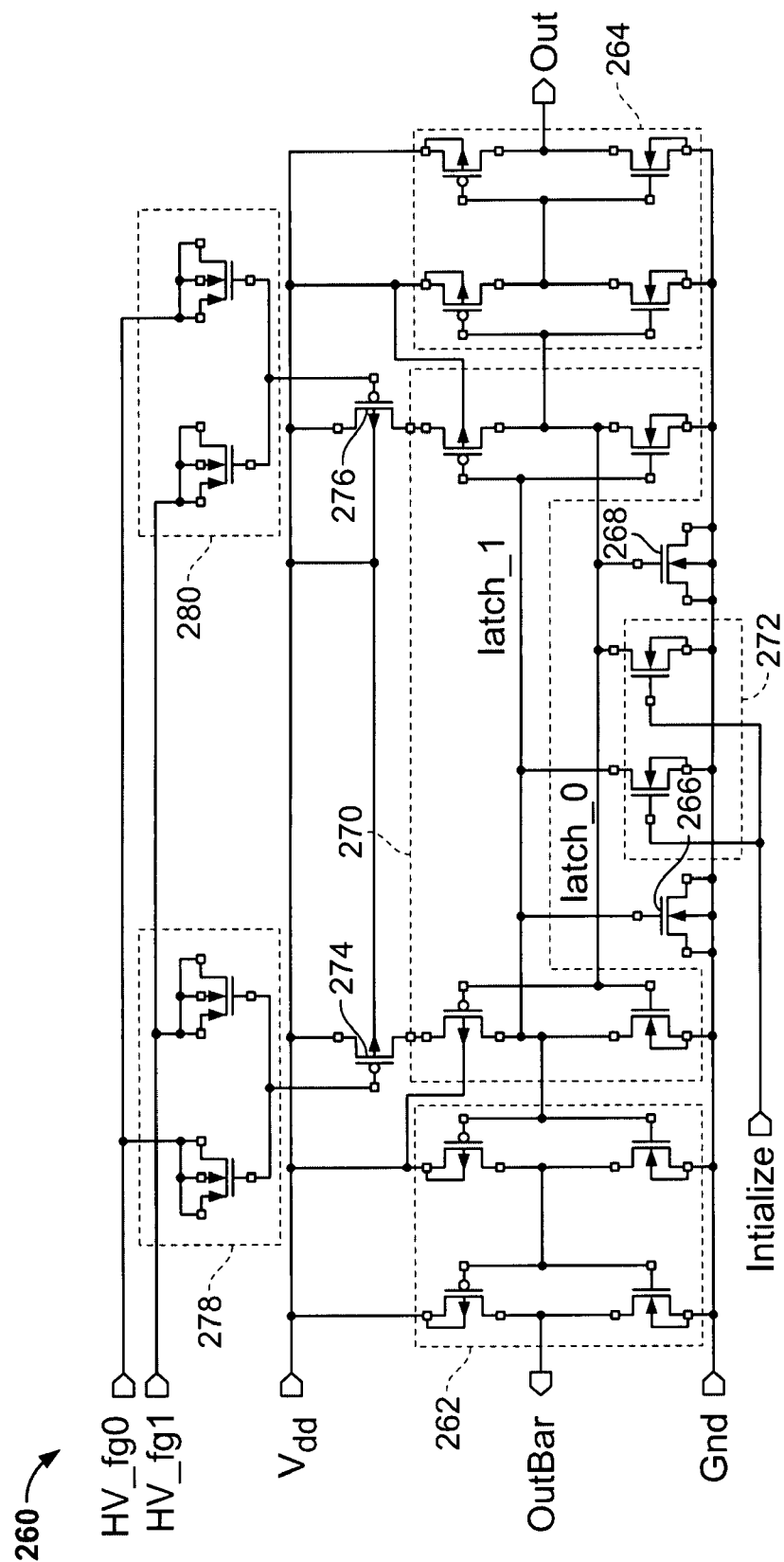
FIG. 28 shows a schematic diagram of an exemplary self-latching, rewriteable symmetric serial fuse, including some of the inventive aspects shown in FIGS. 7, 11 and 18–23, according to an embodiment of the present invention.

FIG. 28 shows a rewriteable electronic fuse 260 incorporating many of the various aspects of the present invention described above. Although the fuse type shown is a symmetric serial fuse as described above in connection with FIG. 7, other of the fuse types described above may alternatively be used in this embodiment. Each output of the latch is coupled to double-buffers 262 and 264. As described above in connection with FIG. 18, buffering the latch outputs helps to prevent load-induced bit errors. First and second capacitors 266 and 268 are also coupled to each of the latch outputs. As described above in connection with FIG. 11, the presence of one or both of the capacitors 266, 268 further assists in ensuring that the latch 270 having cross-coupled latch connections latch 0 and latch 1 latches to a predetermined state. The electronic fuse 260 also contains a reset circuit 272. As described above in connection with FIG. 19, the reset circuit 272 ensures that latch terminals latch_0 and latch_1 are reset to Gnd before latching ensues. Finally, the first and second nonvolatile memory elements 274 and 276, which in this example comprise floating-gate pFETs, have floating gates that are coupled to respective first and second bidirectional tunneling control circuits 278 and 280 which are in turn connected to first and second high voltage terminals HV fg1, respectively. As described above in connection with FIGS. 22 and 23, the bidirectional tunneling control circuits 278, 280 permit the modification and control of the amount of charge stored on the floating gates of the first and second floating-gate transistors 274, 276. Further, as also described in detail above, the ability to control and modify the floating-gate voltages (i.e. the memory values) of the first and second floating-gate transistors 274, 276 allows the latch 270 of the fuse 260 to settle to a predetermined state following a power-up or a reset of the fuse 260.

It is described above how to implement bidirectional tunneling to control and modify the amount of charge on the floating gates of the floating-gate memory elements used in the various fuse embodiments described in this disclosure. Whereas bidirectional tunneling has been described, other charge control techniques may be used. For example, according to an embodiment of the invention, impact-ionized hot-electron injection (IHEI) may be used to tunnel electrons onto the floating gate and FN tunneling may be used to tunnel electrons off of the floating gate.

Figure 29A:
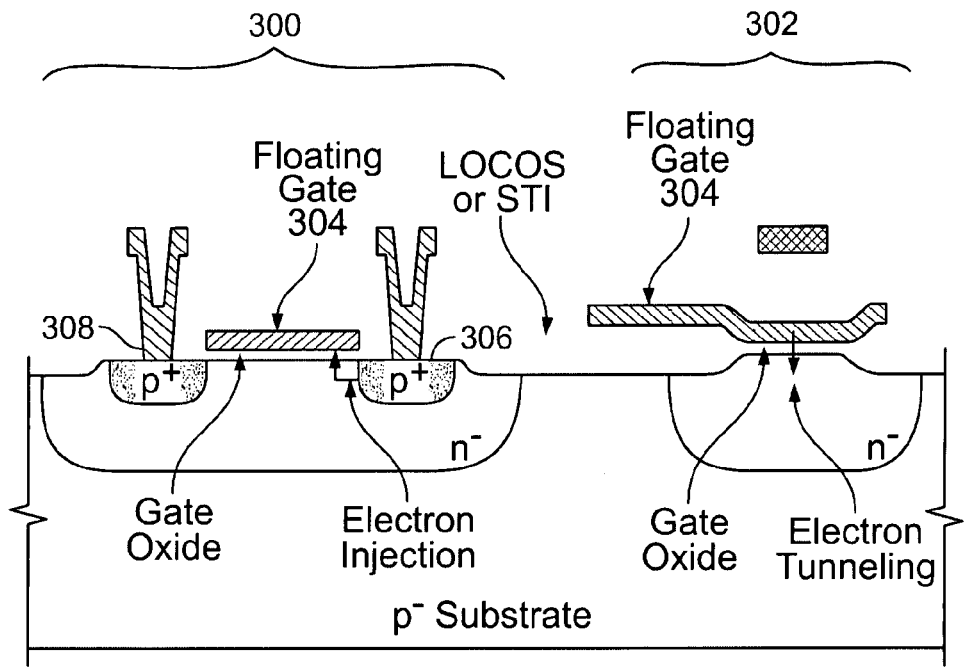
FIG. 29A shows a cross-sectional view of an exemplary floating-gate memory structure, including a single-poly floating-gate pFET, similar to the one shown in FIG. 5A, and a tunneling junction, similar to that shown in FIG. 21, the structure of which may be used to provide alternative charge-control mechanisms to and from the floating gate of the floating-gate transistor (i.e. alternative to the bidirectional tunneling transfer mechanism described in relation to FIGS. 22–26), according to an embodiment of the present invention.
Figure 29B:
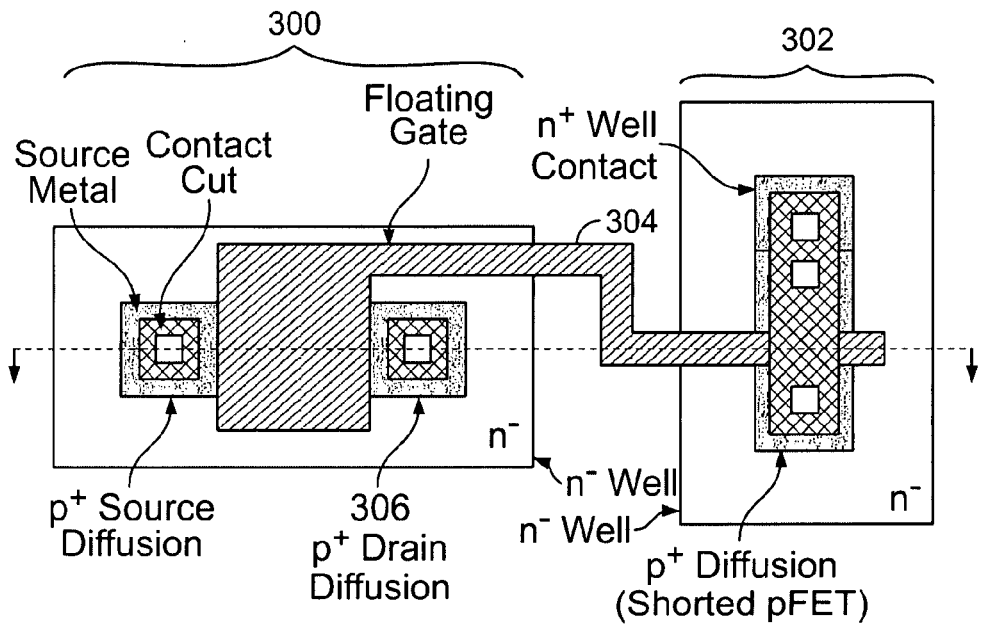
FIG. 29B shows a layout view of the exemplary floating-gate memory structure shown in FIG. 29A, according to an embodiment of the present invention.

FIGS. 29A and 29B show a cross-sectional view (FIG. 29A) and a layout view (FIG. 29B) of a configuration comprising two p-type single-poly floating gate MOSFETs 300 similar to the one shown in FIG. 5A. This configuration, whose fabrication may use LOCOS (local oxidation of silicon) or STI (shallow trench isolation) technology as indicated, uses a combination of FN-tunneling and IHEI to remove electrons from or add electrons to the floating gate, thereby modifying the floating-gate charge. To remove electrons, a positive high voltage is applied between a first plate of the tunneling capacitor 302 and the floating gate 304, thereby inducing FN electron tunneling and causing electrons to tunnel off floating gate 304. The tunneling capacitor 302 includes an n− well formed in the p− substrate. To add electrons, negatively biasing the drain 306 of the floating-gate MOSFET 300 by more than about 3V relative to the source 308 induces a large channel-to-drain electric field, causing holes to rapidly accelerate in MOSFET 300's channel-to-drain depletion region. MOSFET 300 includes an n− well formed in the p− substrate, with p+ regions corresponding to a source and drain being formed in the n− well. Some of the accelerated holes may collide with the semiconductor lattice and ionize electron-hole pairs. Some of the ionized electrons, as well as additional electrons generated by band-to-band electron tunneling in the same channel-to-drain depletion region, are expelled from the channel-to-drain depletion region by this same channel-to-drain electric field. If expelled with sufficient kinetic energy, some of these expelled electrons can be scattered upward and injected onto floating gate 304. These are depicted by the arrow designated electron injection. In the top plan view of FIG. 29B, there is shown a metal source, contact can and p+ source diffusion region of the source of MOSFET 300 and the p+ drain diffusion region. Also shown the n+ well contact well and p+ diffusion region of the short pFET 302.

Whereas single-poly pFET floating-gate transistors have been used to describe many of the various exemplary embodiments of the present invention above, those of ordinary skill in the art will readily appreciate and understand that other types of floating-gate transistors can be used. For example, double-poly floating-gate transistors may be used, or nFET floating-gate transistors, may replace the pFET floating-gate transistors. Accordingly, those fuse embodiments which use floating-gate transistors to implement the nonvolatile memory elements of the various fuse embodiment disclosed herein should not be limited to any particular type of floating-gate transistor. Finally, if the dielectric separating the floating gate and the substrate of a floating-gate transistor is thin enough (e.g., less than about 50 Å) direct tunneling may be used to modify the charge stored on the floating gate of the floating-gate transistor. Direct tunneling is a phenomenon by which electrons tunnel directly through the dielectric layer separating the floating gate and the channel of the floating-gate transistor without the use of high voltages.

Whereas floating-gate transistors have been used to describe many of the various exemplary embodiments of the present invention above, those of ordinary skill in the art will readily appreciate and understand that other types of nonvolatile memory devices can be used. For example, dielectric storage devices (e.g., SONOS), polarized films (e.g., FeRAM), and phase change (e.g., chalcogenide material) nonvolatile memory devices may be used. Accordingly, those fuse embodiments which use nonvolatile properties to implement the nonvolatile memory elements of the various fuse embodiment disclosed herein should not be limited to any particular type of nonvolatile memory devices.

While embodiments and applications of this invention have been shown and described, it will now be apparent to those skilled in the art having the benefit of this disclosure that many more modifications than mentioned above are possible without departing from the inventive concepts disclosed herein. Therefore, the appended claims are intended to encompass within their scope all such modifications as are within the true spirit and scope of this invention.

What is claimed is:

1. An electronic fuse, comprising:
   a latch; and
   a nonvolatile memory element coupled to said latch, said nonvolatile memory element comprising a pair of floating gate devices sharing a common floating gate and configured to be programmed to a memory value capable of causing said latch to settle to a predetermined one of a first state and a second state as a power-up or a reset signal is applied to the fuse, said programming taking place by way of one or both a charge-adding mechanism with which a first floating gate device of said pair is associated and a charge-removing mechanism with which a second floating gate device of said pair is associated.

2. The electronic fuse of claim 1, wherein said latch comprises cross-coupled inverters.

3. The electronic fuse of claim 1, wherein said nonvolatile memory element comprises a floating-gate transistor having a floating gate, an amount of charge on the floating gate determining said memory value.

4. The electronic fuse of claim 1, wherein said nonvolatile memory element comprises a nonvolatile memory element manufactured in a MOS fabrication process.

5. The electronic fuse of claim 3, wherein said floating-gate transistor is a MOS device.

6. The electronic fuse of claim 3, wherein the amount of charge on the floating gate may be changed using Fowler-Nordheim tunneling.

7. The electronic fuse of claim 3, wherein the amount of charge on the floating gate may be changed using hot-electron injection.

8. The electronic fuse of claim 3, wherein the amount of charge on the floating gate may be changed using direct tunneling.

9. The electronic fuse of claim 3, wherein the amount of charge on the floating gate may be changed using hot-hole injection.

10. The electronic fuse of claim 3, wherein said nonvolatile memory element further comprises a first capacitor having a first plate in common with said floating gate of said floating-gate transistor.

11. The electronic fuse of claim 10, wherein the nonvolatile memory element further comprises a second capacitor having a first plate in common with the floating gate of said floating-gate transistor.

12. The electronic fuse of claim 1, further comprising a capacitive element coupled to an output of the latch.

13. The electronic fuse of claim 3, wherein the latch is predisposed to settle into said first state when a voltage of said floating gate is relatively high and into said second state when the floating-gate voltage is relatively low.

14. The electronic fuse of claim 13, further comprising a capacitive element coupled between an output of the latch and a fixed voltage source.

15. The electronic fuse of claim 13, wherein said latch comprises cross-coupled inverters and wherein a first one of the cross-coupled inverters has at least one transistor with a gate-width-to-length ratio that is larger than a gate-width-to-length ratio of at least one of the transistors of a second one of said cross-coupled inverters.

16. The electronic fuse of claim 13, wherein said latch comprises cross-coupled inverters and wherein a first one of the cross-coupled inverters has at least one transistor with a channel doping level that is different from a channel doping level of at least one of the transistors of a second one of said cross-coupled inverters.

17. An electronic fuse, comprising:
a latch having two cross-coupled inverters; and
a nonvolatile memory element coupled between a power source terminal of the fuse and a first of the two inverters of said latch, said nonvolatile memory element comprising a pair of floating gate devices sharing a common floating gate and configured to be programmed to a memory value capable of causing said latch to settle to a predetermined one of a first state and a second state as a power-up or a reset signal is applied to the fuse, said programming taking place by way of one or both a charge-adding mechanism with which a first floating gate device of said pair is associated and a charge-removing mechanism with which a second floating gate device of said pair is associated.

18. The electronic fuse of claim 17, wherein said nonvolatile memory element comprises a floating-gate transistor having a floating gate, an amount of charge on the floating gate determining said memory value.

19. The electronic fuse of claim 17, wherein said nonvolatile memory element comprises a nonvolatile memory element manufactured in a MOS fabrication process.

20. The electronic fuse of claim 18, wherein said floating-gate transistor is a MOS device.

21. The electronic fuse of claim 18, wherein the amount of charge on the floating gate may be changed using Fowler-Nordheim tunneling.

22. The electronic fuse of claim 18, wherein the amount of charge on the floating gate may be changed using hot-electron injection.

23. The electronic fuse of claim 18, wherein the amount of charge on the floating gate may be changed using direct tunneling.

24. The electronic fuse of claim 18, wherein the amount of charge on the floating gate may be changed using hot-hole injection.

25. The electronic fuse of claim 18, wherein said nonvolatile memory element further comprises a first capacitor having a first plate in common with said floating gate of said floating-gate transistor.

26. The electronic fuse of claim 25, wherein the nonvolatile memory element further comprises a second capacitor having a first plate in common with the floating gate of said floating-gate transistor.

27. The electronic fuse of claim 17, further comprising a capacitive element coupled to an output of the latch.

28. The electronic fuse of claim 18, wherein the latch is predisposed to settle into said first state when a voltage of said floating gate is relatively high and into said second state when the floating gate voltage is relatively low.

29. The electronic fuse of claim 28, further comprising a capacitive element coupled between an output of the latch and a fixed voltage source.

30. The electronic fuse of claim 28, wherein said latch comprises cross-coupled inverters and wherein a first one of the cross-coupled inverters has at least one transistor with a gate-width-to-length ratio that is larger than a gate-width-to-length ratio of at least one of the transistors of a second one of said cross-coupled inverters.

31. The electronic fuse of claim 28, wherein said latch comprises cross-coupled inverters and wherein a first one of the cross-coupled inverters has at least one transistor with a channel doping level that is different from a channel doping level of at least one of the transistors of a second one of said cross-coupled inverters.

32. An electronic fuse, comprising:
a latch having two cross-coupled inverters; and
a nonvolatile memory element coupled in parallel with a transistor of a first of the two inverters of the latch, said nonvolatile memory element comprising a pair of floating gate devices sharing a common floating gate and configured to be programmed to a memory value capable of causing said latch to settle to a predetermined one of a first state and a second state as a power-up or a reset signal is applied to the fuse, said programming taking place by way of one or both a charge-adding mechanism with which a first floating gate device of said pair is associated and a charge-removing mechanism with which a second floating gate device of said pair is associated.

33. The electronic fuse of claim 32, wherein said nonvolatile memory element comprises a floating-gate transistor having a floating gate, an amount of charge on the floating gate determining said memory value.

34. The electronic fuse of claim 29, wherein said nonvolatile memory element comprises a nonvolatile memory element manufactured in a MOS fabrication process.

35. The electronic fuse of claim 33, wherein said floating-gate transistor is a MOS device.

36. The electronic fuse of claim 33, wherein the amount of charge on the floating gate may be changed using Fowler-Nordheim tunneling.

37. The electronic fuse of claim 33, wherein the amount of charge on the floating gate may be changed using hot-electron injection.

38. The electronic fuse of claim 33, wherein the amount of charge on the floating gate may be changed using direct tunneling.

39. The electronic fuse of claim 33, wherein the amount of charge on the floating gate may be changed using hot-hole injection.

40. The electronic fuse of claim 33, wherein said nonvolatile memory element further comprises a first capacitor having a first plate in common with said floating gate of said floating-gate transistor.

41. The electronic fuse of claim 40, wherein the nonvolatile memory element further comprises a second capacitor having a first plate in common with the floating gate of said floating-gate transistor.

42. The electronic fuse of claim 32, further comprising a capacitive element coupled to an output of the latch.

43. The electronic fuse of claim 33, wherein the latch is predisposed to settle into said first state when a voltage of said floating gate is relatively high and into said second state when the floating gate voltage is relatively low.

44. The electronic fuse of claim 43, further comprising a capacitive element coupled between an output of the latch and a fixed voltage source.

45. The electronic fuse of claim 43, wherein said latch comprises cross-coupled inverters and wherein a first one of the cross-coupled inverters has at least one transistor with a gate-width-to-length ratio that is larger than a gate-width-to-length ratio of at least one of the transistors of a second one of said cross-coupled inverters.

46. The electronic fuse of claim 43, wherein said latch comprises cross-coupled inverters and wherein a first one of the cross-coupled inverters has at least one transistor with a channel doping level that is different from a channel doping level of at least one of the transistors of a second one of said cross coupled inverters.

47. An electronic fuse, comprising:
a latch;
a first nonvolatile memory element coupled to a first node of the latch, said first nonvolatile memory element configured to be programmed to a first memory value; and
a second nonvolatile memory element coupled to a second node of the latch, said second nonvolatile memory element configured to be programmed to a second memory value,
wherein the first and second programmed memory values cause said latch to settle to a predetermined one of a first and a second state as a power-up or a reset signal is applied to the fuse, and wherein said first and second nonvolatile memory elements each comprises a pair of floating gate devices sharing a common floating gate, said programming taking place by way of one or both a charge-adding mechanism with which a first floating gate device of said pair is associated and a charge-removing mechanism with which a second floating gate device of said pair is associated.

48. The electronic fuse of claim 47, wherein said latch comprises cross-coupled inverters.

49. The electronic fuse of claim 47, wherein said first nonvolatile memory element comprises a first floating-gate transistor having a first floating gate, an amount of charge on the first floating gate determining said first memory value.

50. The electronic fuse of claim 49, wherein said second nonvolatile memory element comprises a second floating-gate transistor having a second floating gate, an amount of charge on the second floating gate determining said second memory value.

51. The electronic fuse of claim 49, wherein said first nonvolatile memory element further comprises a first capacitor having a first plate in common with said first floating gate of said first floating-gate transistor.

52. The electronic fuse of claim 50, wherein said first nonvolatile memory element comprises a first capacitor having a first plate in common with said first floating gate of said first floating-gate transistor and said second nonvolatile memory element further comprises a second capacitor having a first plate in common with said second floating gate.

53. The electronic fuse of claim 47, wherein said first and second nonvolatile memory elements comprise nonvolatile memory elements manufactured in a MQS fabrication process.

54. The electronic fuse of claim 50, wherein at least one of said first and said second floating-gate transistors are MOS devices.

55. The electronic fuse of claim 50, wherein the amount of charge on at least one of said first and second floating gates may be changed using Fowler-Nordheim tunneling.

56. The electronic fuse of claim 50, wherein the amount of charge on at least one of said first and second floating gates may be changed using hot electron injection.

57. The electronic fuse of claim 50, wherein the amount of charge on at least one of said first and second floating gates may be changed using direct tunneling.

58. The electronic fuse of claim 50, wherein the amount of charge on at least one of said first and second floating gates may be changed using hot-hole injection.

59. The electronic fuse of claim 51, wherein the first nonvolatile memory element further comprises a third capacitor having a first plate in common with the first floating gate of said first floating-gate transistor.

60. The electronic fuse of claim 59, wherein the second nonvolatile memory element further comprises a fourth capacitor having a first plate in common with the second floating gate of said second floating-gate transistor.

61. The electronic fuse of claim 47, further comprising a capacitive load coupled to an output of the latch.

62. The electronic fuse of claim 50, wherein the latch is predisposed to settle into one of said first and second states in response to voltages of said first and second floating gates.

63. The electronic fuse of claim 62, further comprising a capacitive element coupled between an output of the latch and a fixed voltage source.

64. The electronic fuse of claim 62, wherein said latch comprises cross-coupled inverters and wherein a first one of the cross-coupled inverters has at least one transistor with a gate-width-to-length ratio that is larger than a gate-widthto-length ratio of at least one of the transistors of a second one of said cross-coupled inverters.

65. The electronic fuse of claim 62, wherein said latch comprises cross-coupled inverters and wherein a first one of the cross-coupled inverters has at least one transistor with a channel doping level that is different from a channel doping level of at least one of the transistors of a second one of said cross-coupled inverters.

66. An electronic fuse, comprising:
a latch having two cross-coupled inverters;
a first nonvolatile memory element coupled between a first power source or reset terminal of the fuse and a first of the two inverters of the latch; and
a second nonvolatile memory element coupled between the first power source or reset terminal of the fuse and a second of the two inverters of the latch,
wherein said first and second nonvolatile memory elements each comprises a pair of floating gate devices sharing a common floating gate, said programming taking place by way of one or both a charge-adding mechanism with which a first floating gate device of said pair is associated and a charge-removing mechanism with which a second floating gate device of said pair is associated.

67. The electronic fuse of claim 66, wherein the first and second nonvolatile memory elements are configured to be programmed to first and second memory values, respectively, said first and second memory values capable of causing said latch to settle to a predetermined one of a first state and a second state as a power-up or a reset signal is applied to the fuse.

68. The electronic fuse of claim 67, wherein said first nonvolatile memory element comprises a first floating-gate transistor having a first floating gate, an amount of charge on the first floating gate determining said first memory value.

69. The electronic fuse of claim 68, wherein said second nonvolatile memory element comprises a second floating-gate transistor having a second floating gate, an amount of charge on the second floating gate determining said second memory value.

70. The electronic fuse of claim 68, wherein said first nonvolatile memory element further comprises a first capacitor having a first plate in common with the first floating gate of said first floating-gate transistor.

71. The electronic fuse of claim 70, wherein said first nonvolatile memory element comprises a first capacitor having a first plate in common with the first floating gate of said first floating-gate transistor said second nonvolatile memory element further comprises a second capacitor having a first plate in common with said second floating gate.

72. The electronic fuse of claim 67, wherein said first and second nonvolatile memory elements comprise nonvolatile memory element manufactured in a MOS fabrication process.

73. The electronic fuse of claim 69, wherein at least one of said first and second floating-gate transistors are MOS devices.

74. The electronic fuse of claim 69, wherein the amount of charge on at least one of said first and second floating gates maybe changed using Fowler-Nordheim tunneling.

75. The electronic fuse of claim 69, wherein the amount of charge on at least one of said first and second floating gates may be changed using hot electron injection.

76. The electronic fuse of claim 69, wherein the amount of charge on at least one of said first and second floating gates may be changed using direct tunneling.

77. The electronic fuse of claim 69, wherein the amount of charge on at least one of said first and second floating gates may be changed using hot-hole injection.

78. The electronic fuse of claim 70, wherein the first nonvolatile memory element further comprises a third capacitor having a first plate in common with the first floating gate of said first floating-gate transistor.

79. The electronic fuse of claim 78, wherein the second nonvolatile memory element further comprises a fourth capacitor having a first plate in common with the second floating gate of said second floating-gate transistor.

80. The electronic fuse of claim 66, further comprising a capacitive load coupled to an output of one of the inverters of the latch.

81. The electronic fuse of claim 69, wherein the latch is predisposed to settle into one of said first and second states in response to voltages of said first and second floating gates.

82. The electronic fuse of claim 81, further comprising a capacitive element coupled between an output of the latch and a fixed voltage source.

83. The electronic fuse of claim 81, wherein said latch comprises cross-coupled inverters and wherein a first one of the cross-coupled inverters has at least one transistor with a gate-width-to-length ratio that is larger than a gate-width-to-length ratio of at least one of the transistors of a second one of said cross-coupled inverters.

84. The electronic fuse of claim 81, wherein said latch comprises cross-coupled inverters and wherein a first one of the cross-coupled inverters has at least one transistor with a channel doping level that is different from a channel doping level of at least one of the transistors of a second one of said cross-coupled inverters.

85. An electronic fuse, comprising:
a latch having two cross-coupled inverters;
a first nonvolatile memory element coupled in parallel with a transistor of a first of the two inverters of the latch; and
a second nonvolatile memory element coupled in parallel with a transistor of a second of the two inverters of the latch,
wherein said first and second nonvolatile memory elements each comprises a pair of floating gate devices sharing a common floating gate, said programming taking place by way of one or both a charge-adding mechanism with which a first floating gate device of said pair is associated and a charge-removing mechanism with which a second floating gate device of said pair is associated.

86. The electronic fuse of claim 85, wherein the first and second nonvolatile memory elements are configured to be programmed to first and second memory values, respectively, said first and second memory values capable of causing said latch to settle to a predetermined one of a first state and a second state as a power-up or a reset signal is applied to the fuse.

87. The electronic fuse of claim 86, wherein said first nonvolatile memory element comprises a first floating-gate transistor having a first floating gate, an amount of charge on the first floating gate determining said first memory value.

88. The electronic fuse of claim 87, wherein said second nonvolatile memory element comprises a second floating-gate transistor having a second floating gate, an amount of charge on the second floating gate determining said second memory value.

89. The electronic fuse of claim 87, wherein said first nonvolatile memory element further comprises a first capacitor having a first plate in common with the first floating gate of said first floating-gate transistor.

90. The electronic fuse of claim 88, wherein said first nonvolatile memory element comprises a first capacitor having a first plate in common with the first floating gate of said first floating-gate transistor said second nonvolatile memory element further comprises a second capacitor having a first plate in common with said second floating gate.

91. The electronic fuse of claim 86, wherein said first and second nonvolatile memory elements comprise nonvolatile memory element manufactured in a MOS fabrication process.

92. The electronic fuse of claim 88, wherein at least one of said first and second floating-gate transistors are MOS devices.

93. The electronic fuse of claim 88, wherein the amount of charge on at least one of said first and second floating gates may be changed using Fowler-Nordheim tunneling.

94. The electronic fuse of claim 88, wherein the amount of charge on at least one of said first and second floating gates may be changed using hot electron injection.

95. The electronic fuse of claim 88, wherein the amount of charge on at least one of said first and second floating gates may be changed using direct tunneling.

96. The electronic fuse of claim 88, wherein the amount of charge on at least one of said first and second floating gates may be changed using hot-hole injection.

97. The electronic fuse of claim 89, wherein the first nonvolatile memory element further comprises a third capacitor having a first plate in common with the first floating gate of said first floating-gate transistor.

98. The electronic fuse of claim 97, wherein the second nonvolatile memory element further comprises a fourth capacitor having a first plate in common with the second floating gate of said second floating-gate transistor.

99. The electronic fuse of claim 85, further comprising a capacitive load coupled to an output of one of the inverters of the latch.

100. The electronic fuse of claim 88, wherein the latch is predisposed to settle into one of said first and second states in response to voltages of said first and second floating gates.

101. The electronic fuse of claim 100, further comprising a capacitive element coupled between an output of the latch and a fixed voltage source.

102. The electronic fuse of claim 100, wherein said latch comprises cross-coupled inverters and wherein a first one of the cross-coupled inverters has at least one transistor with a gate-width-to-length ratio that is larger than a gate-width-to-length ratio of at least one of the transistors of a second one of said cross-coupled inverters.

103. The electronic fuse of claim 100, wherein said latch comprises cross-coupled inverters and wherein a first one of the cross-coupled inverters has at least one transistor with a channel doping level that is different from a channel doping level of at least one of the transistors of a second one of said cross-coupled inverters.

* * * * *